US012603132B2

(12) United States Patent
Zhang et al.

(10) Patent No.: US 12,603,132 B2
(45) Date of Patent: **\*Apr. 14, 2026**

(54) METHODS OF FORMING MICROELECTRONIC DEVICES, AND RELATED MICROELECTRONIC DEVICES, MEMORY DEVICES, AND ELECTRONIC SYSTEMS EACH WITH A FILLED TRENCH WITHIN A STADIUM STRUCTURE OF AT LEAST ONE BLOCK

(71) Applicant: Micron Technology, Inc., Boise, ID (US)

(72) Inventors: Rui Zhang, Boise, ID (US); Shuangqiang Luo, Boise, ID (US); Mohad Baboli, Boise, ID (US); Rajasekhar Venigalla, Boise, ID (US)

(73) Assignee: Micron Technology, Inc., Boise, ID (US)

( \* ) Notice: Subject to any disclaimer, the term of this patent is extended or adjusted under 35 U.S.C. 154(b) by 291 days.

This patent is subject to a terminal disclaimer.

(21) Appl. No.: 18/327,846

(22) Filed: Jun. 1, 2023

(65) Prior Publication Data

US 2023/0395150 A1 Dec. 7, 2023

Related U.S. Application Data

(60) Provisional application No. 63/365,748, filed on Jun. 2, 2022.

(51) Int. Cl.
*G11C 16/04* (2006.01)
*H01L 21/768* (2006.01)
(Continued)

(52) U.S. Cl.
CPC .... *G11C 16/0483* (2013.01); *H01L 21/76831* (2013.01); *H01L 23/5226* (2013.01);
(Continued)

(58) Field of Classification Search
CPC .... G11C 16/0483; H10B 43/35; H10B 41/35; H10B 41/27; H10B 43/27; H01L 21/76831; H01L 23/5283; H10L 23/5226
See application file for complete search history.

(56) References Cited

U.S. PATENT DOCUMENTS 11,665,894 B2    5/2023   Larsen et al.
11,812,614 B2 \*  11/2023  Zhang ................... H10B 41/35
(Continued)

*Primary Examiner* — Michael Jung
(74) *Attorney, Agent, or Firm* — TraskBritt

(57)    ABSTRACT

A microelectronic device includes a stack structure including blocks separated from one another by dielectric slot structures and each including a vertically alternating sequence of conductive structures and insulative structures arranged in tiers. The blocks including a stadium structure including opposing staircase structures each having steps comprising edges of the tiers. The blocks further include a filled trench vertically overlying and within horizontal boundaries of the stadium structure. The filled trench includes dielectric liner structures and additional dielectric liner structures having a different material composition than that of the dielectric liner structures and alternating with the dielectric liner structures. The filled trench also includes dielectric fill material overlying an alternating sequence of the dielectric liner structures and additional dielectric liner structures.

20 Claims, 17 Drawing Sheets

(51) Int. Cl.

| | | |
|---|---|---|
| *H01L 23/522* | (2006.01) |
| *H01L 23/528* | (2006.01) |
| *H10B 41/27* | (2023.01) |
| *H10B 41/35* | (2023.01) |
| *H10B 43/27* | (2023.01) |
| *H10B 43/35* | (2023.01) |

(52) U.S. Cl.
   CPC ......... *H01L 23/5283* (2013.01); *H10B 41/27* (2023.02); *H10B 41/35* (2023.02); *H10B 43/27* (2023.02); *H10B 43/35* (2023.02)

(56) References Cited

U.S. PATENT DOCUMENTS

| | | | | |
|---|---|---|---|---|
| 11,837,498 | B2 * | 12/2023 | Lee .................... | H01L 21/76816 |
| 11,917,817 | B2 * | 2/2024 | Luo ........................ | H10B 41/27 |
| 2019/0096810 | A1 | 3/2019 | Zhu et al. | |
| 2021/0384124 | A1 | 12/2021 | Wang et al. | |
| 2022/0102375 | A1 * | 3/2022 | Kubo .................... | H10B 41/35 |

* cited by examiner

*900*

METHODS OF FORMING MICROELECTRONIC DEVICES, AND RELATED MICROELECTRONIC DEVICES, MEMORY DEVICES, AND ELECTRONIC SYSTEMS EACH WITH A FILLED TRENCH WITHIN A STADIUM STRUCTURE OF AT LEAST ONE BLOCK

CROSS-REFERENCE TO RELATED APPLICATION

This application claims the benefit under 35 U.S.C. § 119(e) of U.S. Provisional Patent Application Ser. No. 63/365,748, filed Jun. 2, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory (NVM) devices, such as flash memory devices (e.g., NAND flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including structures of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive material of the tiers of the stack structure(s) of the memory device and control logic devices (e.g., string drivers) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions for the conductive material of the tiers, upon which conductive contact structures can be positioned to provide electrical access to the conductive material. In turn, conductive routing structures can be employed to couple the conductive contact structures to the control logic devices. However, conventional staircase structure fabrication techniques can segment the conductive material of an individual tier in a manner resulting in discontinuous conductive paths through the tier that can require the use of multiple (e.g., more than one) switching devices (e.g., transistors) of at least one string driver to drive voltages completely across the tier and/or in opposing directions across the tier.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

DETAILED DESCRIPTION

Figure 1A:
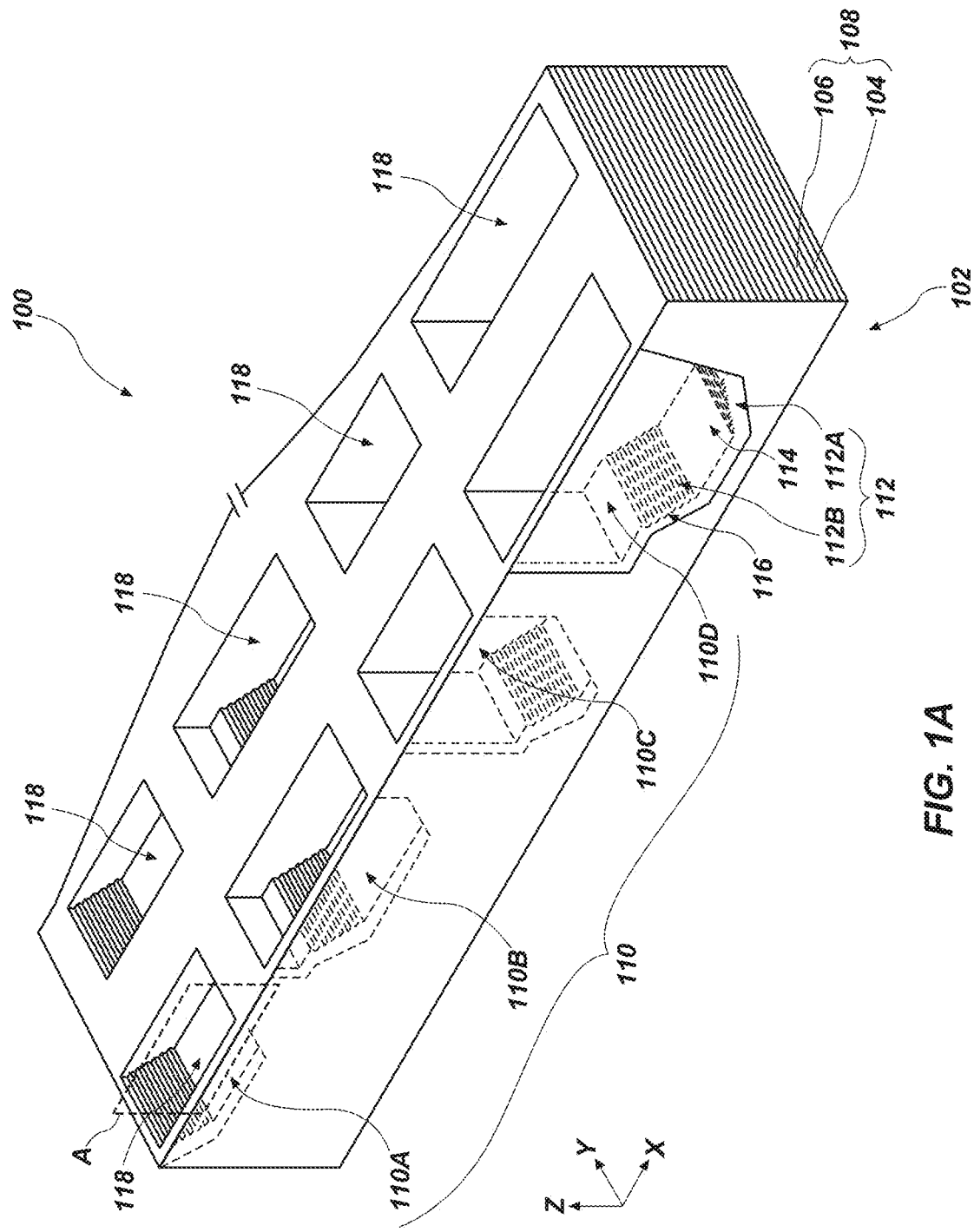
FIG. 1A is a simplified, partial perspective view of a microelectronic device structure at a processing stage of a method forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional non-volatile memory; conventional volatile memory), but also includes an application specific integrated circuit (ASIC) (e.g., a system on a chip (SoC)), a microelectronic device combining logic and memory, and a graphics processing unit (GPU) incorporating memory.

As used herein, the terms "configured" and "configuration" refers to a size, a shape, a material composition, a material distribution, orientation, and arrangement of at least one feature (e.g., one or more of at least one structure, at least one material, at least one region, at least one device) facilitating use of the at least one feature in a pre-determined way.

As used herein, the term "substantially" in reference to a given parameter means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, relational terms, such as "beneath," "below," "lower," "bottom," "above," "upper," "top," "front," "rear," "left," "right," and the like, may be used for ease of description to describe one element's or feature's relationship to another element(s) or feature(s) as illustrated in the drawings. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the term "and/or" means and includes any and all combinations of one or more of the associated listed items.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the drawings, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_{-x-}$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_x N_y$)), at least one dielectric oxycarbide material (e.g., silicon oxycarbide ($SiO_x C_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_x C_z N_y$)). Formulae including one or more of "x," "y," and "z" herein (e.g., $SiO_x$, $AlO_x$, $HfO_x$, $NbO_{-x}$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic material deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1A through FIG. 7B are various views (described in further detail below) illustrating a microelectronic device structure at different processing stages of a method of forming a microelectronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Figure 1B:
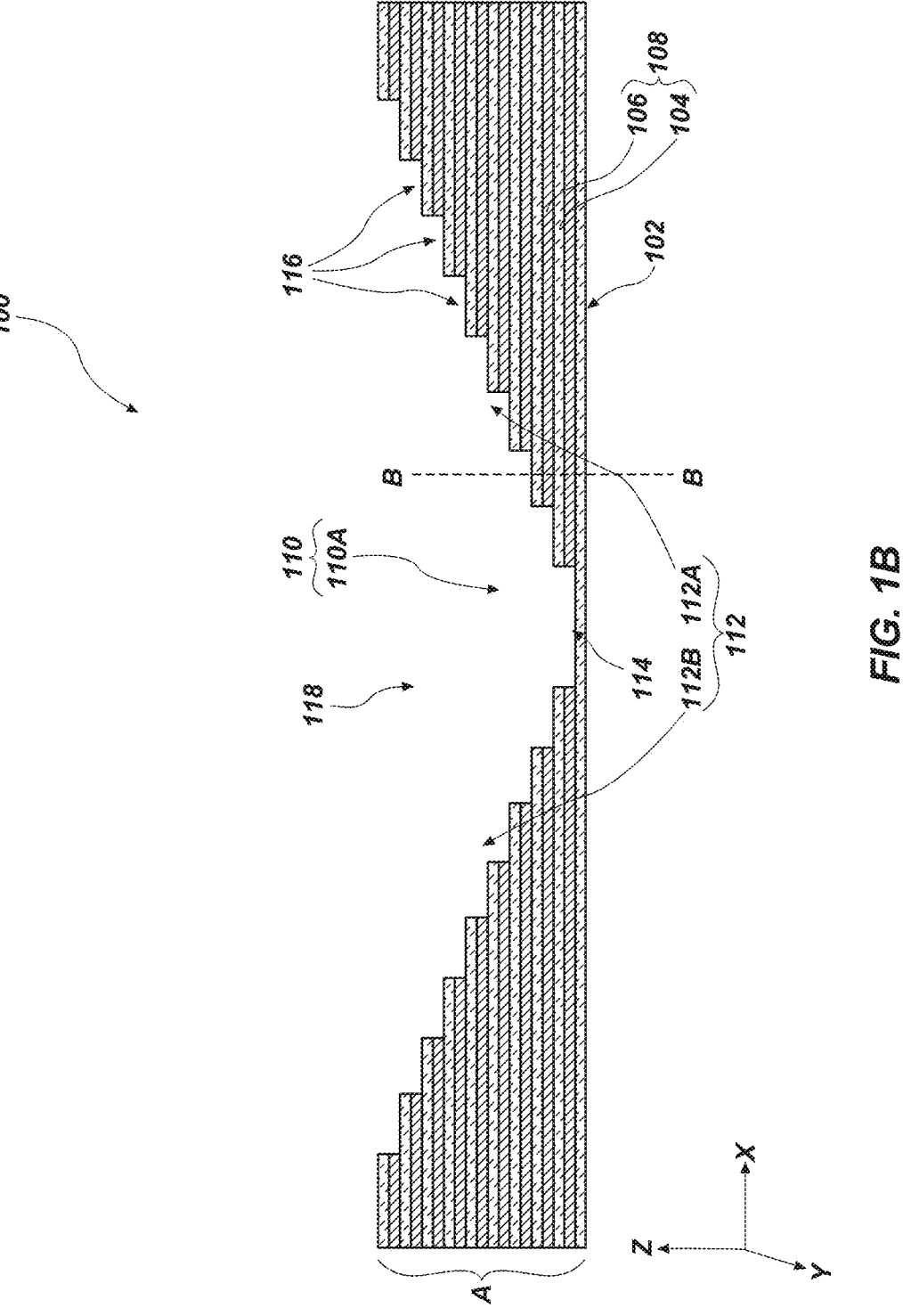
FIG. 1B is a simplified, longitudinal cross-sectional view of a portion A (identified with dashed lines in FIG. 1A) of the microelectronic device structure at the processing stage of FIG. 1A.
Figure 1C:
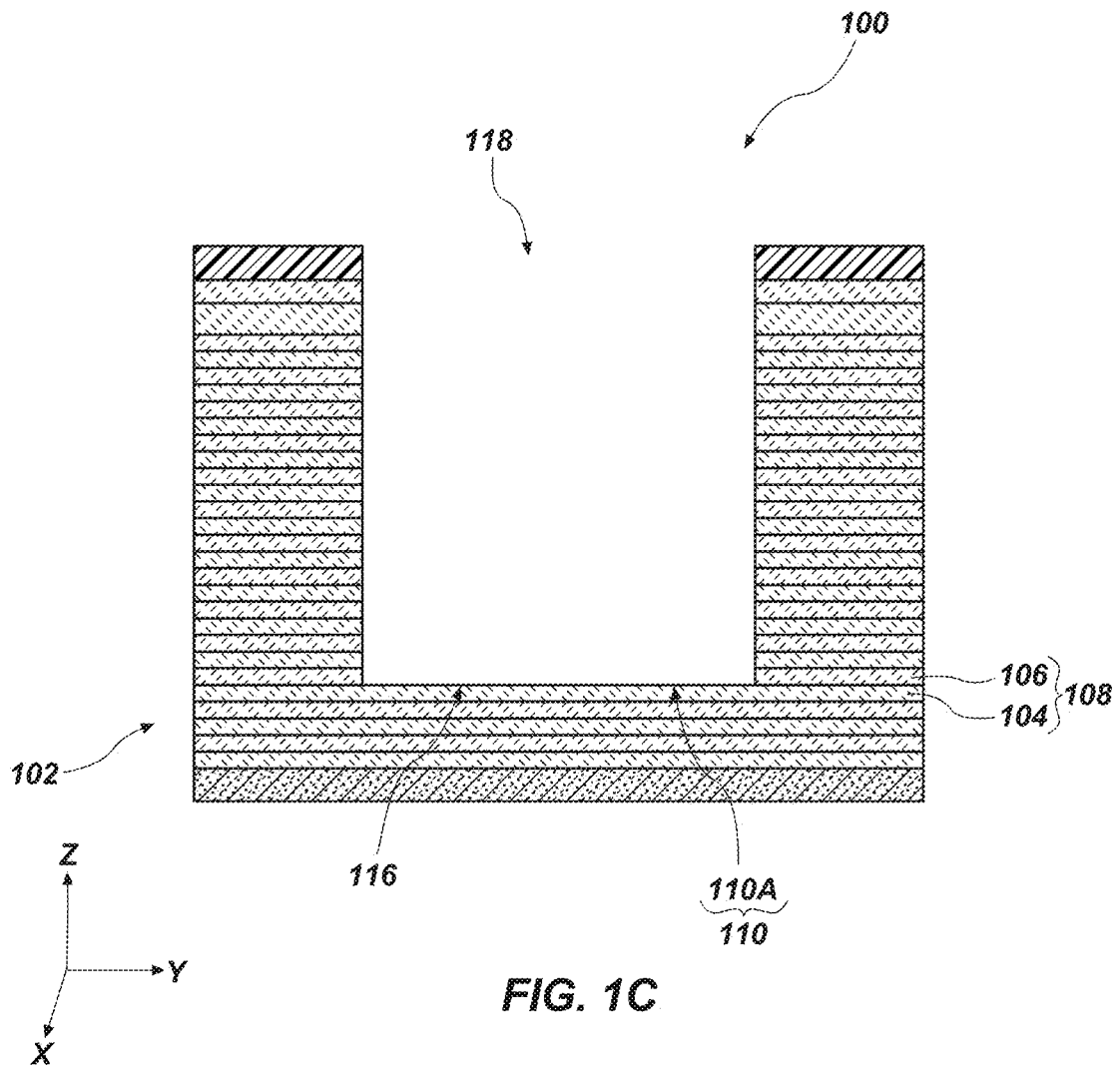
FIG. 1C is a simplified, partial longitudinal cross-sectional view of a portion of the microelectronic device structure at the processing stage of FIGS. 1A and 1B about a dashed line B-B shown in FIG. 1B.

FIG. 1A depicts a simplified, partial perspective view of a microelectronic device structure 100. As shown in FIG. 1A, the microelectronic device structure 100 may be formed to include a preliminary stack structure 102 including a vertically alternating (e.g., in a Z-direction) sequence of insulative material 104 and sacrificial material 106 arranged in tiers 108. Each of the tiers 108 of the preliminary stack structure 102 may individually include the sacrificial material 106 vertically neighboring (e.g., directly vertically adjacent) the insulative material 104. FIG. 1B is a simplified, longitudinal cross-sectional view of a portion A (identified with a dashed box in FIG. 1A) of the microelectronic device structure 100 at the processing stage depicted in FIG. 1A. FIG. 1C is a simplified, partial longitudinal cross-sectional view of a portion of the microelectronic device structure at the processing stage of FIGS. 1A and 1B about a dashed line B-B shown in FIG. 1B.

The insulative material 104 of each of the tiers 108 of the preliminary stack structure 102 may be formed of and include at least one dielectric material, such one or more of at least one dielectric oxide material (e.g., one or more of $SiO_x$, phospho silicate glass, borosilicate glass, borophosphosilicate glass, fluorosilicate glass, $AlO_x$, $HfO_x$, $NbO_{-x-}$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_z\,N_y$). In some embodiments, the insulative material 104 of each of the tiers 108 of the preliminary stack structure 102 is formed of and includes a dielectric oxide material, such as $SiO_x$ (e.g., $SiO_2$). The insulative material 104 of each of the tiers 108 may be substantially homogeneous, or the insulative material 104 of one or more (e.g., each) of the tiers 108 may be heterogeneous.

The sacrificial material 106 of each of the tiers 108 of the preliminary stack structure 102 may be formed of and include at least one material (e.g., at least one insulative material) that may be selectively removed relative to the insulative material 104. The sacrificial material 106 may be selectively etchable relative to the insulative material 104 during common (e.g., collective, mutual) exposure to a first etchant; and the insulative material 104 may be selectively etchable to the sacrificial material 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, depending on the material composition of the insulative material 104, the sacrificial material 106 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_{-x-}$, $TiO_x$, $ZrO_x$, $TaO_x$, and a $MgO_x$), at least one dielectric nitride material (e.g., $SiN_y$), at least one dielectric oxynitride material (e.g., $SiO_x\,N_y$), at least one dielectric oxycarbide material (e.g., $SiO_xC_y$), at least one hydrogenated dielectric oxycarbide material (e.g., $SiC_xO_yH_z$), at least one dielectric carboxynitride material (e.g., $SiO_x\,C_z\,N_y$), and at least one semiconductive material (e.g., polycrystalline silicon). In some embodiments, the sacrificial material 106 of each of the tiers 108 of the preliminary stack structure 102 is formed of and includes a dielectric nitride material, such as $SiN_y$ (e.g., $Si_3N_4$). The sacrificial material 106 may, for example, be selectively etchable relative to the insulative material 104 during common exposure to a wet etchant comprising phosphoric acid ($H_3PO_4$).

The preliminary stack structure 102 may be formed to include any desired number of the tiers 108. By way of non-limiting example, the preliminary stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

As shown in FIG. 1A, the preliminary stack structure 102 may include stadium structures 110 formed therein. The stadium structures 110 may be distributed throughout the preliminary stack structure 102. As shown in FIG. 1A, the preliminary stack structure 102 may include rows of the stadium structures 110 extending in parallel in a X-direction, and columns of the stadium structures 110 extending in a Y-direction orthogonal to the X-direction. The rows of the stadium structures 110 may individually include some of the stadium structures 110 at least partially (e.g., substantially) aligned with one another in the Y-direction. The columns of the of the stadium structures 110 may individually include other of the stadium structures 110 at least partially (e.g., substantially) aligned with one another in the X-direction. Different rows of the stadium structures 110 may be positioned within different horizontal areas of the preliminary stack structure 102 to be formed into different blocks of a stack structure to be formed from the preliminary stack structure 102, as described in further detail below. In FIG. 1A, for clarity and ease of understanding the drawings and associated description, portions of the preliminary stack structure 102 are depicted as transparent to more clearly show some of the stadium structures 110 distributed within the preliminary stack structure 102.

Still referring to FIG. 1A, at least some (e.g., each) of the stadium structures 110 within an individual row of the stadium structures 110 may be positioned at different vertical elevations in the Z-direction than one another. For example, as depicted in FIG. 1A, an individual row of the stadium structures 110 may include a first stadium structure 110A, a second stadium structure 110B at a relatively lower vertical position (e.g., in the Z-direction) within the preliminary stack structure 102 than the first stadium structure 110A, a third stadium structure 110C at a relatively lower vertical position within the preliminary stack structure 102 than the second stadium structure 110B, and a fourth stadium structure 110D at a relatively lower vertical position within the block 130 than the third stadium structure 110C. In addition, within an individual row of the stadium structures 110, horizontally neighboring (e.g., in the X-direction) stadium structures 110 may be substantially uniformly (e.g., equally, evenly) horizontally spaced apart from one another. In additional embodiments, one or more rows of the stadium structures 110 may individually include a different quantity of stadium structures 110 and/or a different distribution of stadium structures 110 than that depicted in FIG. 1A. For example, an individual row of the stadium structures 110 may include greater than four (4) of the stadium structures 110 (e.g., greater than or equal to five (5) of the stadium structures 110, greater than or equal to ten (10) of the stadium structures 110, greater than or equal to twenty-five (25) of the stadium structures 110, greater than or equal to fifty (50) of stadium structures 110), or less than four (4) of the stadium structures 110 (e.g., less than or equal to three (3) of the stadium structures 110, less than or equal to two (2) of the stadium structures 110, only one (1) of the stadium structures 110). As another example, within an individual row of the stadium structures 110, at least some horizontally neighboring stadium structures 110 may be at least partially non-uniformly (e.g., non-equally, non-evenly) horizontally spaced, such that at least one of the stadium structures 110 of the row is separated from at least two other of the stadium structures 110 of the row horizontally neighboring the at least one stadium structures 110 by different (e.g., non-equal) distances. As an additional non-limiting example, within an individual row of the stadium structures 110, vertical positions (e.g., in the Z-direction) of the stadium structures 110 may vary in a different manner (e.g., may alternate between relatively deeper and relatively shallower vertical positions) than that depicted in FIG. 1A.

Each stadium structure 110 may include opposing staircase structures 112, and a central region 114 horizontally interposed between (e.g., in the X-direction) the opposing staircase structures 112. The opposing staircase structures 112 of each stadium structure 110 may include a forward staircase structure 112A and a reverse staircase structure 112B. A phantom line extending from a top of the forward staircase structure 112A to a bottom of the forward staircase structure 112A may have a positive slope, and another phantom line extending from a top of the reverse staircase structure 112B to a bottom of the reverse staircase structure 112B may have a negative slope. In additional embodiments, one or more of the stadium structures 110 may individually exhibit a different configuration than that depicted in FIG. 1A. As a non-limiting example, at least one stadium structure 110 may be modified to include a forward staircase structure 112A but not a reverse staircase structure 112B (e.g., the reverse staircase structure 112B may be absent), or at least one stadium structure 110 may be modified to include a reverse staircase structure 112B but not a forward staircase structure 112A (e.g., the forward staircase structure 112A may be absent). In such embodiments, the central region 114 horizontally neighbors a bottom of the forward staircase structure 112A (e.g., if the reverse staircase structure 112B is absent), or the central region 114 horizontally neighbors a bottom of the reverse staircase structure 112B (e.g., if the forward staircase structure 112A is absent).

The opposing staircase structures 112 (e.g., the forward staircase structure 112A and the reverse staircase structure 112B) of an individual stadium structure 110 each include steps 116 defined by edges (e.g., horizontal ends) of the tiers 108 of the preliminary stack structure 102. For the opposing staircase structures 112 of an individual stadium structure 110, each step 116 of the forward staircase structure 112A may have a counterpart step 116 within the reverse staircase structure 112B having substantially the same geometric configuration (e.g., shape, dimensions), vertical position (e.g., in the Z-direction), and horizontal distance (e.g., in the X-direction) from a horizontal center (e.g., in the X-direction) of the central region 114 of the stadium structure 110. In additional embodiments, at least one step 116 of the forward staircase structure 112A does not have a counterpart step 116 within the reverse staircase structure 112B having substantially the same geometric configuration (e.g., shape, dimensions), vertical position (e.g., in the Z-direction), and/or horizontal distance (e.g., in the X-direction) from horizontal center (e.g., in the X-direction) of the central region 114 of the stadium structure 110; and/or at least one step 116 of the reverse staircase structure 112B does not have a counterpart step 116 within the forward staircase structure 112A having substantially the same geometric configuration (e.g., shape, dimensions), vertical position (e.g., in the Z-direction), and/or horizontal distance (e.g., in the X-direction) from horizontal center (e.g., in the X-direction) of the central region 114 of the stadium structure 110.

Each of the stadium structures 110 of the preliminary stack structure 102 may individually include a desired quantity of steps 116. Each of the stadium structures 110 may include substantially the same quantity of steps 116 as each other of the stadium structures 110, or at least one of the stadium structures 110 may include a different quantity of steps 116 than at least one other of the stadium structures 110. In some embodiments, at least one of the stadium structures 110 includes a different (e.g., greater, lower) quantity of steps 116 than at least one other of the stadium structures 110. As shown in FIG. 1A, in some embodiments, the steps 116 of each of the stadium structures 110 are arranged in order, such that steps 116 directly horizontally adjacent (e.g., in the X-direction) one another correspond to tiers 108 of the preliminary stack structure 102 directly vertically adjacent (e.g., in the Z-direction) one another. In additional embodiments, the steps 116 of at least one of the stadium structures 110 are arranged out of order, such that at least some steps 116 of the stadium structure 110 directly horizontally adjacent (e.g., in the X-direction) one another correspond to tiers 108 of preliminary stack structure 102 not directly vertically adjacent (e.g., in the Z-direction) one another.

With continued reference to FIG. 1A, for an individual stadium structure 110, the central region 114 thereof may horizontally intervene (e.g., in the X-direction) between and separate the forward staircase structure 112A thereof from the reverse staircase structure 112B thereof. The central region 114 may horizontally neighbor a vertically lowermost step 116 of the forward staircase structure 112A, and may also horizontally neighbor a vertically lowermost step 116 of the reverse staircase structure 112B. The central region 114 of an individual stadium structure 110 may have desired horizontal dimensions. In addition, the central region 114 of each of the stadium structures 110 may have substantially the same horizontal dimensions as the central region 114 of each other of the stadium structures 110, or the central region 114 of at least one of the stadium structures 110 may have different horizontal dimensions than the central region 114 of at least one other of the stadium structures 110.

Still referring to FIG. 1A, each stadium structure 110 (including the forward staircase structure 112A, the reverse staircase structure 112B, and the central region 114 thereof) within the preliminary stack structure 102 may individually partially define boundaries (e.g., horizontal boundaries, vertical boundaries) of a trench 118 vertically extending (e.g., in the Z-direction) through the preliminary stack structure 102. The portions of the preliminary stack structure 102 horizontally neighboring an individual stadium structure 110 may also partially define the boundaries of the trench 118 associated with the stadium structure 110. The trench 118 may vertically extend through tiers 108 of the preliminary stack structure 102 defining the forward staircase structure 112A and the reverse staircase structure 112B of the stadium structure 110; or may also vertically extend through additional tiers 108 of the preliminary stack structure 102 not defining the forward staircase structure 112A and the reverse staircase structure 112B of the stadium structure 110, such as additional tiers 108 of the preliminary stack structure 102 vertically overlying the stadium structure 110. Edges of the additional tiers 108 of the preliminary stack structure 102 may, for example, define one or more additional stadium structures vertically overlying and horizontally offset from the stadium structure 110. The trench 118 may subsequently be filled with one or more dielectric materials, as described in further detail below.

As previously described, FIG. 1B is a simplified, longitudinal cross-sectional view of portion A (identified with a dashed box in FIG. 1A) of the microelectronic device structure 100 at the processing stage depicted in FIG. 1A. The portion A encompasses the first stadium structure 110A of an individual row of the stadium structures 110 within the preliminary stack structure 102 (FIG. 1A). The portion A also encompasses regions of the preliminary stack structure 102 horizontally neighboring the first stadium structure 110A in the X-direction and the Y-direction. While additional features (e.g., structures, materials) of the microelectronic device structure 100 are described hereinbelow with reference to the portion A of the microelectronic device structure 100, such additional features may also be formed and included in additional portions of the microelectronic device structure 100, including additional portions encompassing additional stadium structures 110 of the preliminary stack structure 102 (FIG. 1A) and additional regions of the preliminary stack structure 102 having boundaries defined by the additional stadium structures 110.

In addition, as also previously described, FIG. 1C is a simplified, partial longitudinal cross-sectional view of a portion of the microelectronic device structure 100 at the processing stage of FIGS. 1A and 1B about a dashed line B-B shown in FIG. 1B. As shown in FIG. 1C, the insulative material 104 and the sacrificial material 106 of each tier 108 of the preliminary stack structure 102 having horizontal ends defining an individual stadium structure 110 (e.g., the first stadium structure 110A) within the preliminary stack structure 102 may continuously horizontally extend in the X-direction across sides of the stadium structure 110 opposing one another in the Y-direction. In addition, for an individual stadium structure 110 within the preliminary stack structure 102, inner horizontal boundaries (e.g., inner sidewalls) of the preliminary stack structure 102 partially defining the trench 118 associated with (e.g., vertically overlying and within horizontal boundaries of) the stadium structure 110 may be oriented substantially perpendicular to uppermost vertical boundaries (e.g., uppermost surfaces) of the preliminary stack structure 102, or may be oriented substantially non-perpendicular to the uppermost vertical boundaries (e.g., uppermost surfaces) of the preliminary stack structure 102.

Figure 2A:
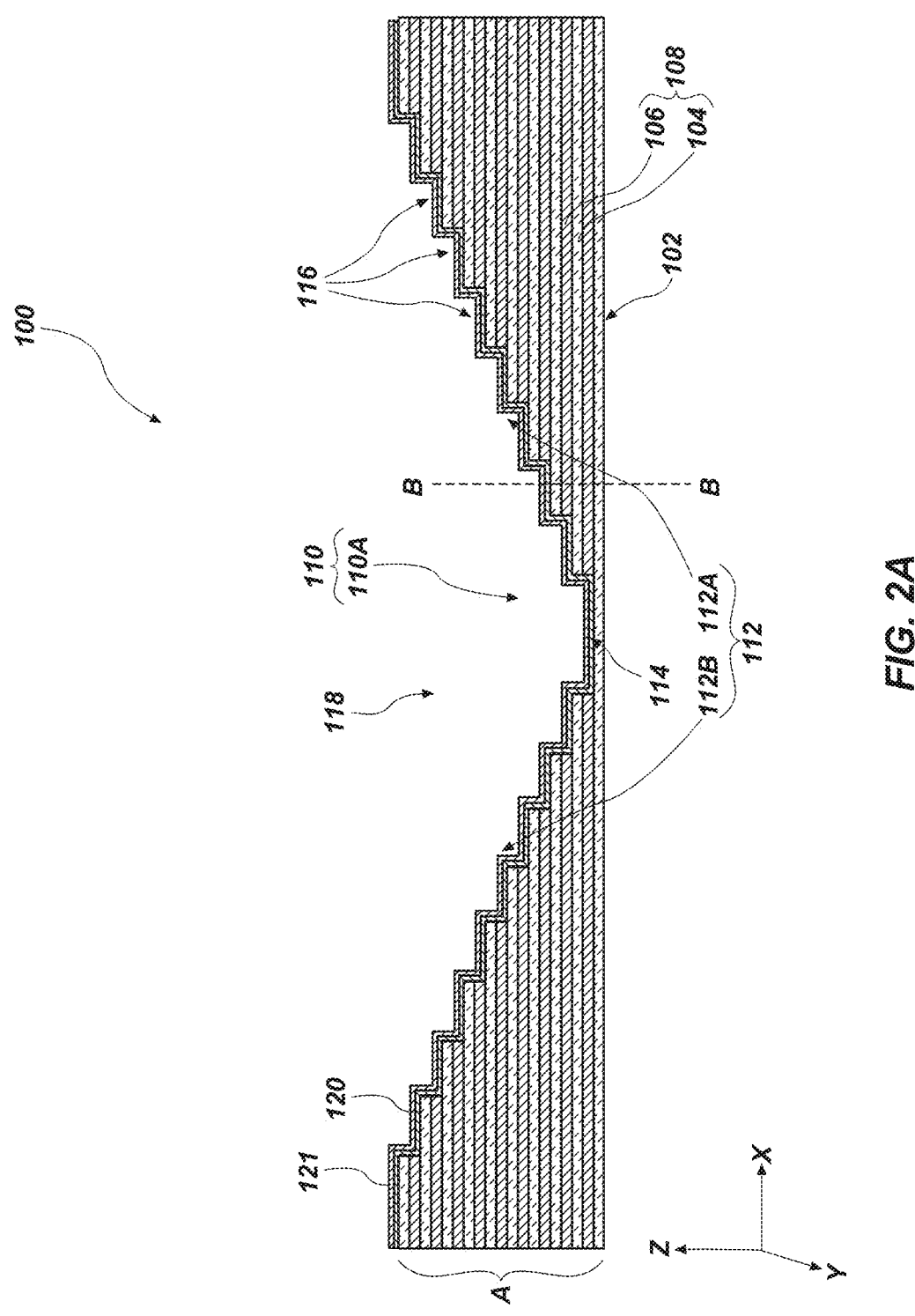
FIG. 2A is a simplified, longitudinal cross-sectional view of the portion A of the microelectronic device structure shown in FIGS. 1A through 1C at another processing stage of the method forming the microelectronic device following the processing stage of FIGS. 1A through 1C.
Figure 2B:
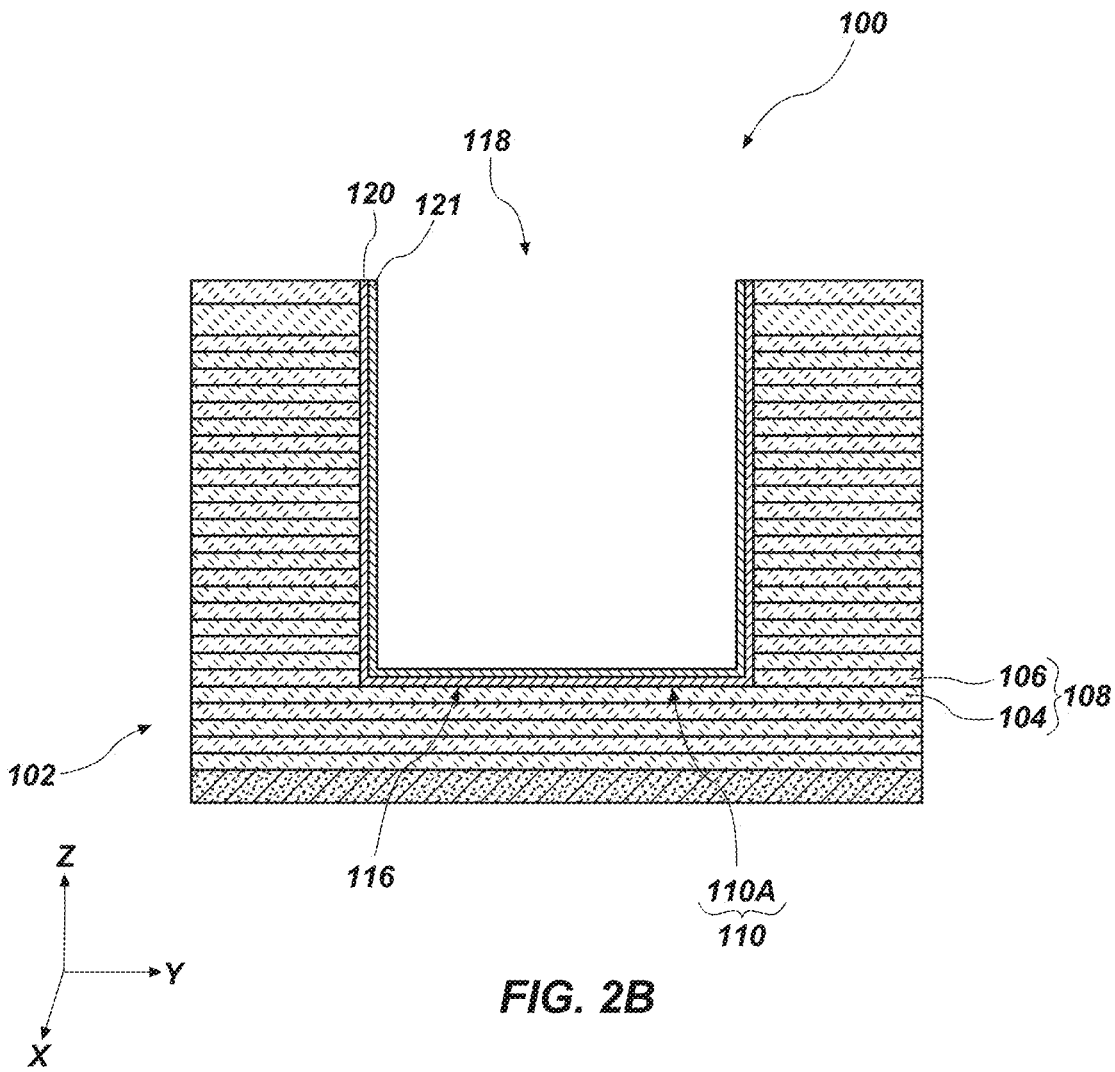
FIG. 2B is a simplified, partial longitudinal cross-sectional view of a portion of the microelectronic device structure at the processing stage of FIG. 2A about the dashed line B-B shown in FIG. 2A.

Referring next to FIG. 2A, which is a simplified, longitudinal cross-sectional view of the portion A of the microelectronic device structure 100 following the processing stage previously described with reference to FIGS. 1A through 1C, a dielectric barrier liner 120 may be formed on or over portions of the preliminary stack structure 102 defining the stadium structures 110 and the trenches 118. FIG. 2B is a simplified, partial longitudinal cross-sectional view of a portion of the microelectronic device structure 100 at the processing stage of FIG. 2A about a dashed line B-B shown in FIG. 2A.

As shown in FIG. 2A, the dielectric barrier liner 120 may be formed to substantially continuously extend on or over surfaces (e.g., horizontally extending surfaces, vertically extending surfaces) of the stadium structure 110 and the preliminary stack structure 102 defining boundaries (e.g., horizontal boundaries, vertical boundaries) of the trench 118. The dielectric barrier liner 120 may be formed to substantially continuously extend on or over the opposing staircase structures 112 (e.g., the forward staircase structure 112A and the reverse staircase structure 112B) and the central region 114 of each of the stadium structures 110, as well as on or over inner sidewalls of the preliminary stack structure 102 horizontally neighboring (e.g., in the Y-direction) each of the stadium structures 110.

The dielectric barrier liner 120 may be employed (e.g., serve) as a barrier material to protect (e.g., mask) one or more additional materials to subsequently be formed from removal during subsequent processing acts (e.g., subsequent etching acts, support structure formation, contact structure formation), as described in further detail below. The dielectric barrier liner 120 may be formed to have a desired thickness, such as a thickness within a range of from about 2 nanometers (nm) to about 50 nm (e.g., from about 5 nm to about 40 nm).

The dielectric barrier liner 120 may be formed of and include at least one dielectric material having different etch selectivity than the sacrificial material 106. The dielectric barrier liner 120 may also have different etch selectivity than at least one additional material (e.g., at least one additional dielectric material) to subsequently be formed within remaining portions the trenches 118. By way of non-limiting example, the dielectric barrier liner 120 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_{-x-}$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_z\ N_y$). In some embodiments, the dielectric barrier liner 120 is formed of and includes a dielectric oxide material, such as $SiO_x$ (e.g., $SiO_2$). The dielectric barrier liner 120 may be substantially homogeneous, or may be heterogeneous.

Figure 3A:
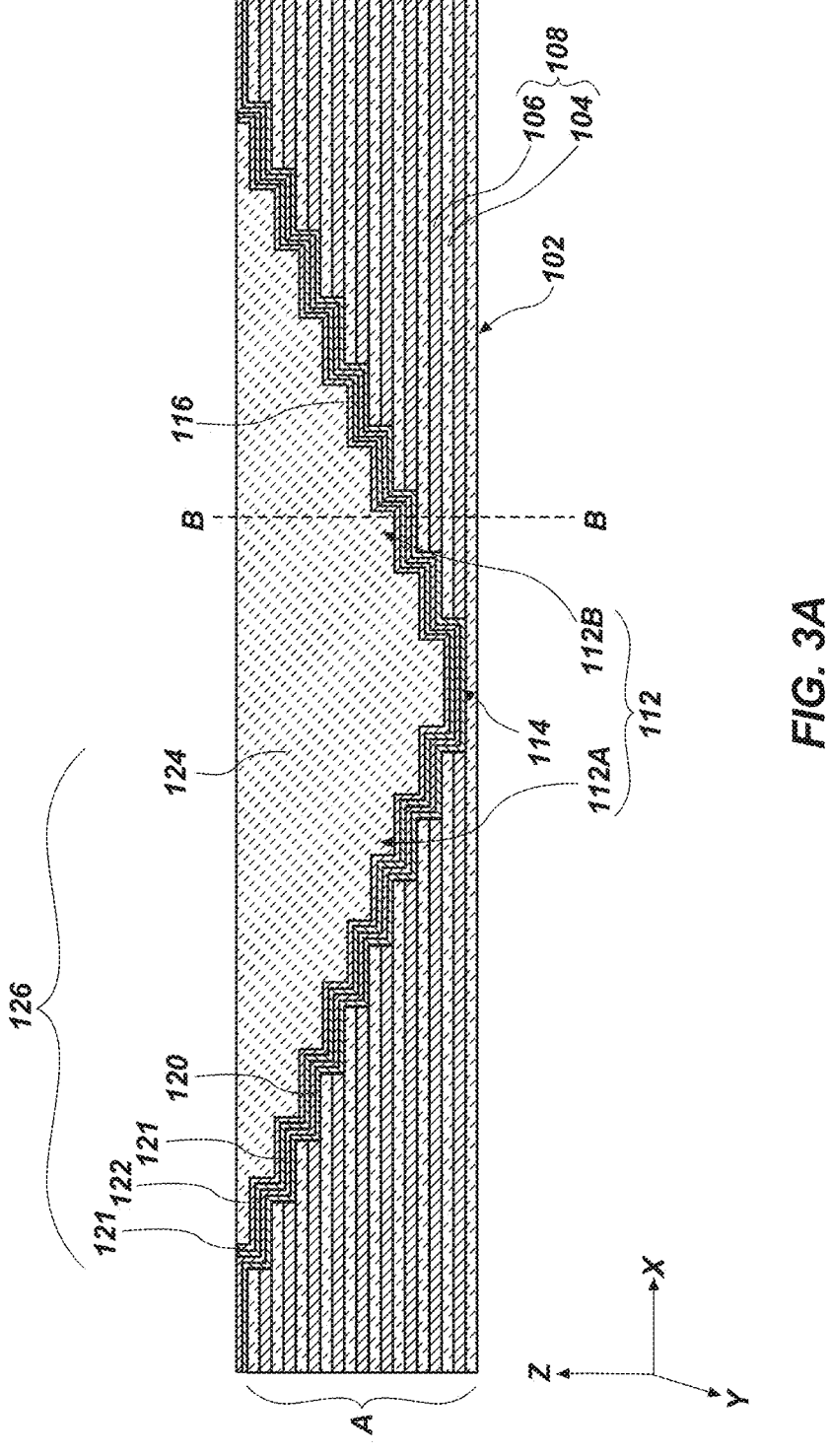
FIG. 3A is a simplified, longitudinal cross-sectional view of the portion A of the microelectronic device structure shown in FIGS. 1A through 1C at another processing stage of the method forming the microelectronic device following the processing stage of FIGS. 2A and 2B.
Figure 3B:
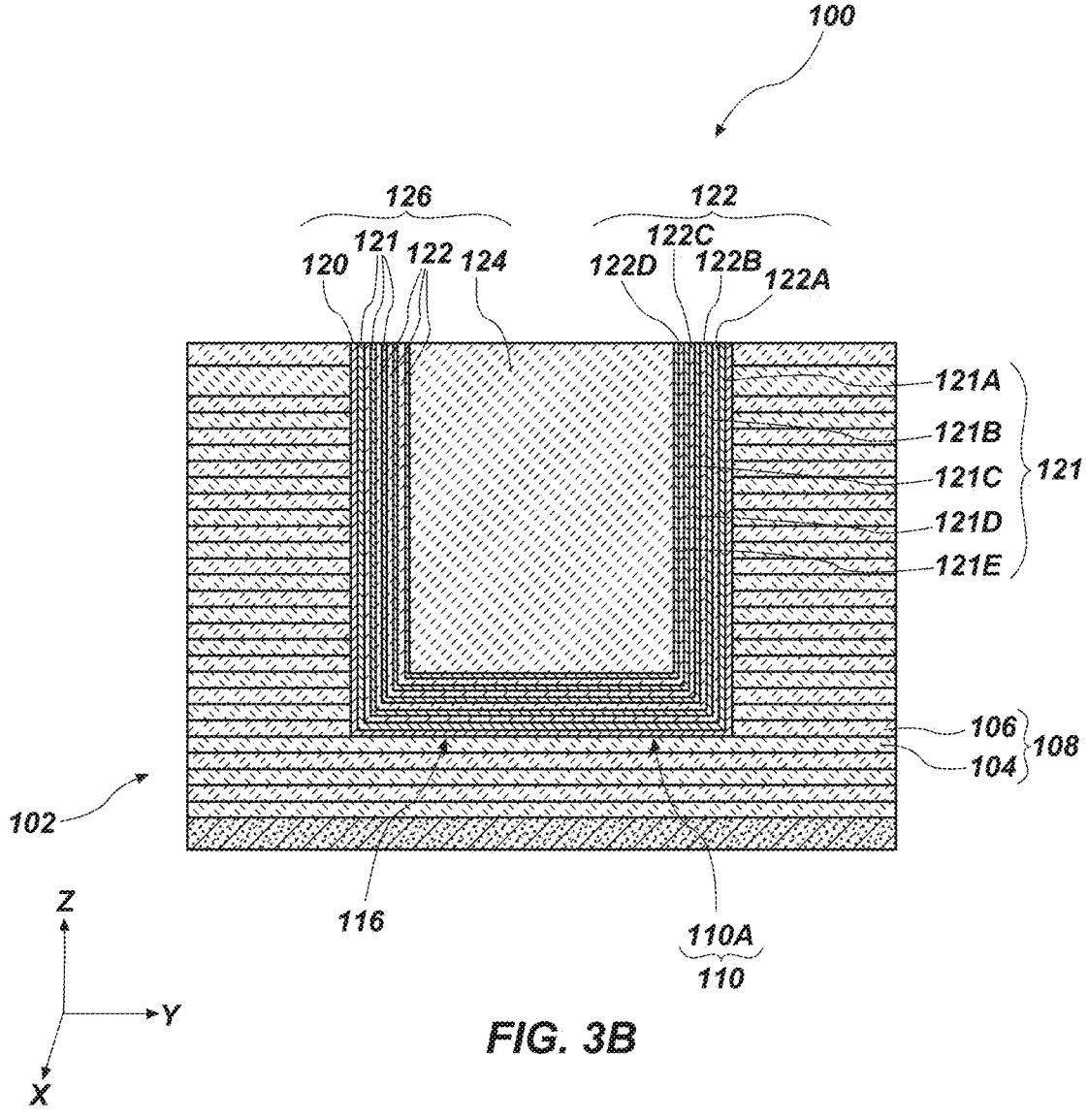
FIG. 3B is a simplified, partial longitudinal cross-sectional view of a portion of the microelectronic device structure at the processing stage of FIG. 3A about the dashed line B-B shown in FIG. 3A.

Referring to FIGS. 3A and 3B, dielectric liner structures 121, additional dielectric liner structures 122, and dielectric fill material 124 may be formed within remaining portions of the trenches 118 (FIGS. 2A and 2B) unoccupied by the dielectric barrier liner 120 to form filled trenches 126. The filled trenches 126 may individually include the dielectric barrier liner 120, dielectric liner structures 121, additional dielectric liner structures 122, and dielectric fill material 124.

As illustrated in FIGS. 3A and 3B, the dielectric liner structures 121 may be formed to alternate with additional dielectric liner structures 122 within the filled trenches 126, and the dielectric fill material 124 may be formed to occupy remainders of the filled trenches 126 not occupied by the dielectric barrier liner 120, the dielectric liner structures 121, and the additional dielectric liner structures 122. An alternating sequence of the dielectric liner structures 121 and the additional dielectric liner structures 122 may be formed over the dielectric barrier liner 120, and then the dielectric fill material 124 may be formed over the alternating sequence of the dielectric liner structures 121 and the additional dielectric liner structures 122. The dielectric fill material 124 may be formed to substantially continuously extend on or over an uppermost one of the dielectric liner structures 121 and the additional dielectric liner structures 122. The filled trenches 126 may individually be formed to exhibit a substantially planer upper vertical boundary, and a substantially non-planar lower vertical boundary complementary to (e.g., substantially mirroring) a topography thereunder.

As shown in FIG. 3B, multiple (e.g., more than one) dielectric liner structures 121 and multiple (e.g., more than one) additional dielectric liner structures 122 may be formed within the trenches 118 (FIGS. 2A and 2B). By way of non-limiting example, within an individual trench 118 (FIGS. 2A and 2B), the dielectric liner structures 121 may be formed to include a first dielectric liner structure 121A, a second dielectric liner structure 121B, a third dielectric liner structure 121C, a fourth dielectric liner structure 121D, and a fifth dielectric liner structure 121E; and the dielectric liner structures 122 may be formed to include a first additional dielectric liner structure 122A, a second additional dielectric liner structure 122B, a third additional dielectric liner structure 122C, and a fourth additional dielectric liner structure 122D. In additional embodiments, a different quantity (e.g., less than four, such as less than or equal to three, less than or equal to two, or one; more than four, such as greater than or equal to five, greater than or equal to ten, greater than or equal to twenty) of the dielectric liner structures 121 may be formed, and/or different quantity (e.g., less than four, such as less than or equal to three, less than or equal to two, or one; more than four, such as greater than or equal to five, greater than or equal to ten, greater than or equal to twenty) of the additional dielectric liner structures 122 may be formed. For clarity and ease of understanding the drawings and related description, only two dielectric liner structures 121 and a single additional dielectric liner structure 122 are depicted in FIG. 3A. However, it will be understood that the disclosure is not so limited, and the quantity of the dielectric liner structures 121 and additional dielectric liner structures 122 more particularly illustrated in FIG. 3B or different quantities of the dielectric liner structures 121 and additional dielectric liner structures 122 may be formed.

Each of the dielectric liner structures 121 may be formed of and include dielectric material. A material composition of the dielectric liner structures 121 may be different than material compositions of the dielectric barrier liner 120 and the additional dielectric liner structures 122. The dielectric liner structures 121 may have different etch selectivity than the dielectric barrier liner 120 and the additional dielectric liner structures 122. By way of non-limiting example, the dielectric liner structures 121 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_{-x-}$, $TiO_x$, $ZrO_x$, $TaO_x$, and a $MgO_x$), at least one dielectric nitride material (e.g., $SiN_y$), at least one dielectric oxynitride material (e.g., $SiO_x\ N_y$), at least one dielectric oxycarbide material (e.g., $SiO_xC_y$), at least one hydrogenated dielectric oxycarbide material (e.g., $SiC_x\ O_yH_z$), at least one dielectric carboxynitride material (e.g., $SiO_x\ C_z\ N_y$), and at least one semiconductive material (e.g., polycrystalline silicon). In some embodiments, the dielectric liner structures 121 are individually formed of and include dielectric nitride material, such as $SiN_y$ (e.g., $Si_3N_4$). The dielectric liner structures 121 may individually be substantially homogeneous, or may individually be heterogeneous.

Each of the additional dielectric liner structures 122 may be formed of and include additional dielectric material. A material composition of the additional dielectric liner structures 122 may be different than material compositions of the dielectric liner structure 122. The material composition of the additional dielectric liner structures 122 may be substantially the same as or may be different than the material composition of the dielectric barrier liner 120. The additional dielectric liner structures 122 may have different etch selectivity than at least the dielectric liner structures 121. By way of non-limiting example, the additional dielectric liner structures 122 may individually be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_{-x-}$, $TiO_x$, $ZrO_x$, $TaO_x$, and a $MgO_x$), at least one dielectric nitride material (e.g., $SiN_y$), at least one dielectric oxynitride material (e.g., $SiO_x\ N_y$), at least one dielectric oxycarbide material (e.g., $SiO_x\ C_y$), at least one hydrogenated dielectric oxycarbide material (e.g., $SiC_x\ O_yH_z$), at least one dielectric carboxynitride material (e.g., $SiO_x\ C_z\ N_y$), and at least one semiconductive material (e.g., polycrystalline silicon). In some embodiments, the additional dielectric liner structures 122 are individually formed of and include dielectric oxide material, such as $SiO_x$ (e.g., $SiO_2$). The additional dielectric liner structures 122 may individually be substantially homogeneous, or may individually be heterogeneous.

The dielectric liner structures 121 and the additional dielectric liner structures 122 may individually be formed to desired thicknesses. In some embodiments, thicknesses of the dielectric liner structures 121 are substantially uniform relative to one another; and thicknesses of the additional dielectric liner structures 122 are substantially uniform relative to one another. As described in further detail below with respect to FIG. 4, the dielectric liner structures 121 may be formed to have different thicknesses than the dielectric liner structures 122.

The dielectric fill material 124 may be formed of and include at least one dielectric material having different etch selectivity than that of at least the dielectric liner structures 121. By way of non-limiting example, the dielectric fill material 124 may be formed of and include at least one oxygen-containing dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_{-x-}$, and $TiO_{-x}$), at least one dielectric oxynitride material (e.g., $SiO_x\ N_y$), and at least one dielectric carboxynitride material (e.g., $SiO_x\ C_z\ N_y$). In some embodiments, the dielectric fill material 124 is formed of and includes $SiO_x$ (e.g., $SiO_2$).

As described in further detail below with reference to FIG. 5C, the microelectronic device structure 100 may be formed to further include contact structures vertically extending through the preliminary stack structure 102. At least some of the contact structures may, for example, be configured and positioned to support the tiers 108 of the preliminary stack structure 102 during subsequent processing (e.g., replacement gate processing) of the microelectronic device structure 100. For example, the contact structures may be configured and positioned to impede (e.g., substantially prevent) collapse of portions of the insulative material 104 of the tiers 108 with horizontal areas of the stadium structures 110 during subsequent replacement gate processing acts.

As shown in FIGS. 3A and 3B, within horizontal boundaries of each of the stadium structures 110, the dielectric fill material 124 covers and surrounds the alternating sequence of the dielectric liner structures 121 and the additional dielectric liner structures 122. For example, the dielectric fill material 124 may be formed on horizontally extending upper surfaces and vertically extending side surfaces of an uppermost one of the additional dielectric liner structures 122 (e.g., the fourth additional dielectric liner structure 122D), or may be formed on horizontally extending upper surfaces and vertically extending side surfaces of an uppermost one of the dielectric liner structures 121 (e.g., the fifth dielectric liner structure 121E).

Figure 4:
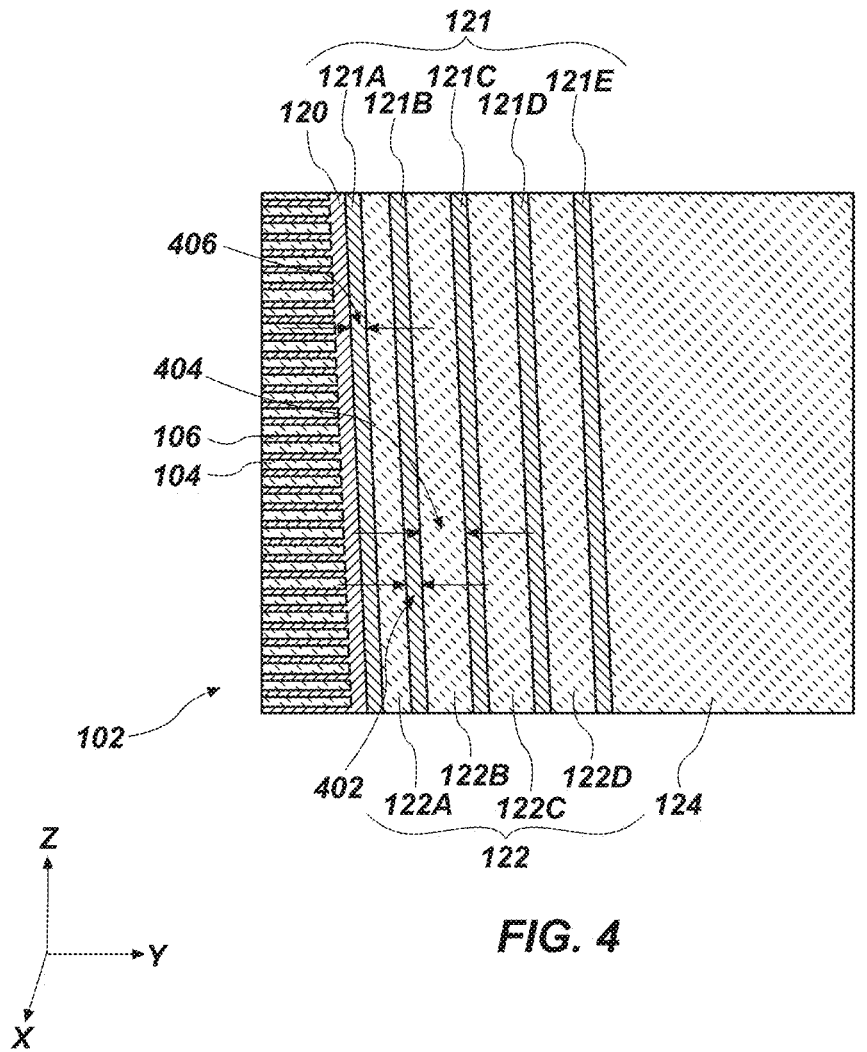
FIG. 4 illustrates an enlarged view of a portion of the simplified, partial longitudinal cross-sectional view of the microelectronic device structure illustrated in FIG. 3B.

FIG. 4 illustrates an enlarged view of a region of microelectronic device structure 100 including the alternating sequence of the dielectric liner structures 121 and the additional dielectric liner structures 122. As the number of dielectric liner structure 121 increase, a thickness 402 of each of the individual dielectric liner structures 121 may decrease such that the total thickness of the dielectric liner material of the dielectric liner structures 121 (e.g., the thickness 402 of each individual dielectric liner structure 121A, 121B, 121C, 121D, 121E added together excluding a thickness 404 of the additional dielectric liner structures 122 between the materials) is less than about 200 nm.

Each of the dielectric liner structures 121 (e.g., the dielectric liner structures 121A, 121B, 121C, 121D, 121E) may individually have a thickness 402 in a range from about 2 nm and about 200 nm, such as from about 6 nm to about 100 nm, or from about 20 nm to about 60 nm. In some embodiments, each of the dielectric liner structures 121 may have substantially the same thickness 402. In other embodiments, at least one of the dielectric liner structures 121 (e.g., the first dielectric liner structure 121A) may have a different thickness 402 than at least one other of the dielectric liner structures 121. In some embodiments, first dielectric liner structure 121A has a greater thickness 402 than that of at least one other of the dielectric liner structures 121 (e.g., one or more of dielectric liner structures 121B, 121C, 121D, 121E), such that the first dielectric liner structure 121A may act as a final etch stop material within the filled trenches 126. The presence of the second dielectric liner structure 121B, the third dielectric liner structure 121C, the fourth dielectric liner structure 121D, and/or the fifth dielectric liner structure 121E may facilitate reducing the thickness 406 of the first dielectric liner structure 121A. Each dielectric liner structure 121B, 121C, 121D, 121E of the dielectric liner structures 121 may be combined with the first dielectric liner structure 121A to form a total, combined thickness of the dielectric liner structures 121 that is within a range from about 60 nm to about 200 nm. Reducing the thickness of the individual dielectric liner structures 121A, 121B, 121C, 121D, 121E may reduce the likelihood of unwanted etch stop characteristics during later processing, such as during the formation of various contact structure openings, as described in further detail below.

As described above, the additional dielectric liner structures 122 may be positioned between the dielectric liner structures 121 (e.g., the dielectric liner structures 121A, 121B, 121C, 121D, 121E). Each of the additional dielectric liner structures 122 (e.g., each of the additional dielectric liner structures 122A, 122B, 122C, 122D) may individually have a thickness 404 that define the spacing between the neighboring dielectric liner structures 121. The thickness 404 of each of the additional dielectric liner structures 122 may be substantially uniform. In some embodiments, the thickness 404 each of the additional dielectric liner structures 122 is within a range from about 240 nm to about 19 nm, such as from about 50 nm to about 20 nm.

Figure 5A:
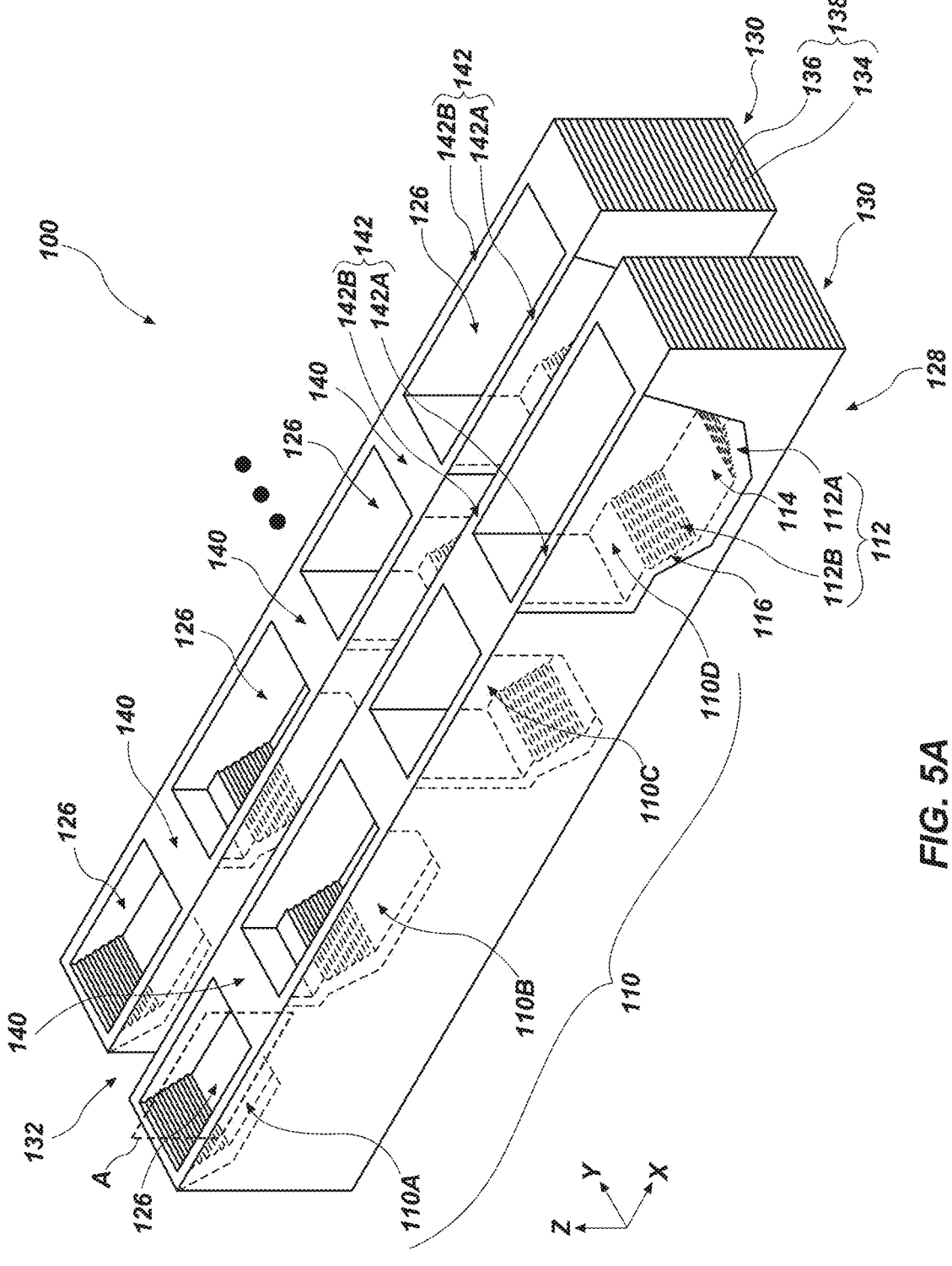
FIG. 5A is a simplified, partial perspective view of the microelectronic device structure shown in FIGS. 1A through 1C at another processing stage of the method forming the microelectronic device following the processing stage of FIGS. 3A and 3B.
Figure 5B:
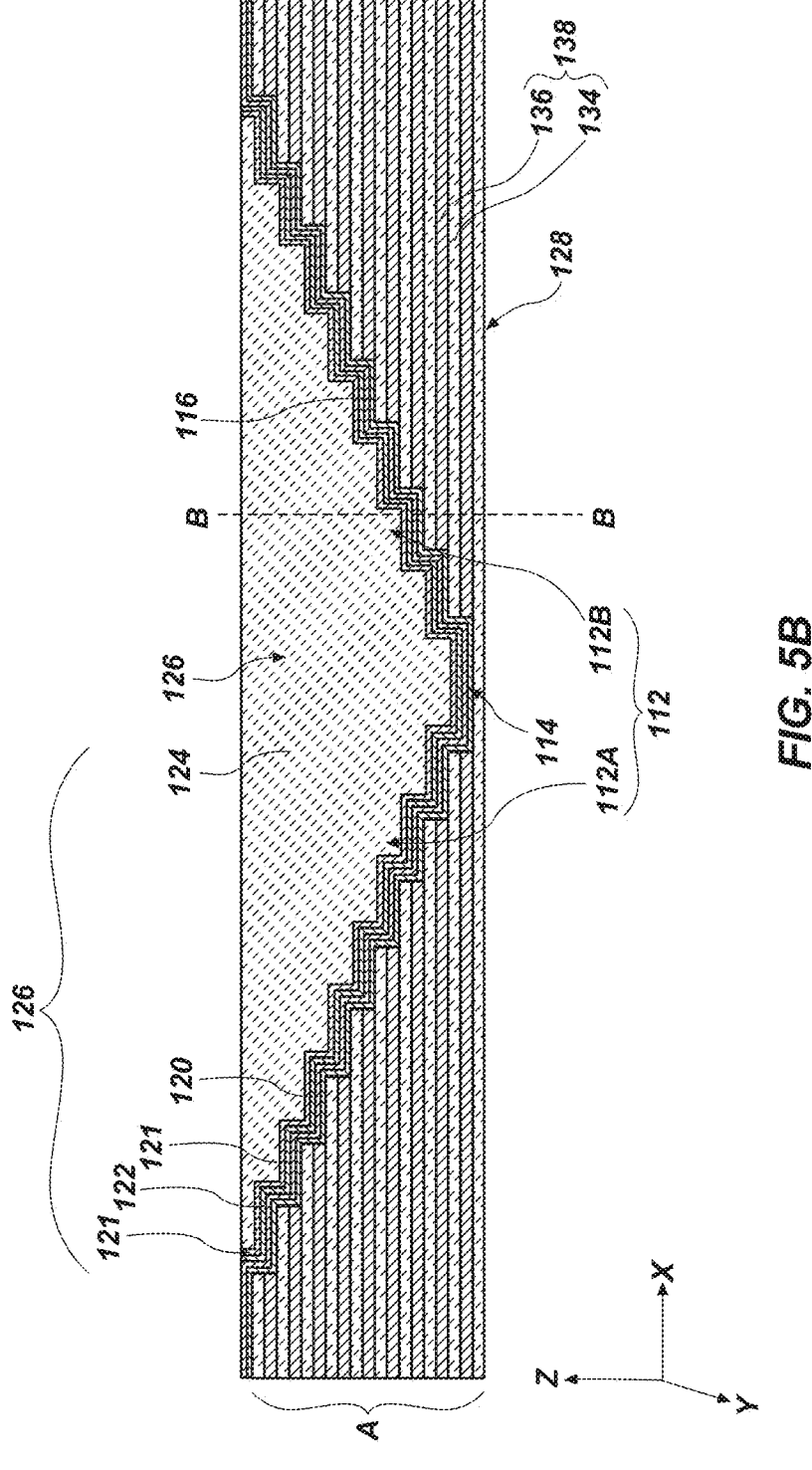
FIG. 5B is a simplified, longitudinal cross-sectional view of the portion A of the microelectronic device structure shown at the processing stage of FIG. 5A.

Referring next to FIG. 5A, which is a simplified, partial perspective view of a microelectronic device structure 100 following the processing stage previously described with reference to FIGS. 3A, 3B, and 4, the preliminary stack structure 102 (FIGS. 3A and 3B) may be partitioned (e.g., divided, segmented) and subject to replacement gate processing to form a stack structure 128. The stack structure 128 may be divided into blocks 130 separated from one another by slot structures 132. The slot structures 132 may vertically extend (e.g., in the Z-direction) completely through the stack structure 128. Additional features (e.g., materials, structures) of the stack structure 128 (including the blocks 130 thereof) are described in further detail below. In FIG. 5A, for clarity and ease of understanding the drawings and associated description, the slot structures 132 are depicted as transparent to more clearly show features of the blocks 130. FIG. 5B is a simplified, longitudinal cross-sectional view of the portion A of the microelectronic device structure 100 at the processing stage depicted in FIG. 5A. FIG. 5C is a simplified, partial longitudinal cross-sectional view of a portion of the microelectronic device structure 100 at the processing stage of FIGS. 5A and 5B about a dashed line B-B shown in FIG. 5B.

As shown in FIG. 5A, the blocks 130 of the stack structure 128 may be formed to horizontally extend parallel in an X-direction. As used herein, the term "parallel" means substantially parallel. Horizontally neighboring blocks 130 of the stack structure 128 may be separated from one another in a Y-direction orthogonal to the X-direction by the slot structures 132. The slot structures 132 may also horizontally extend parallel in the X-direction. Each of the blocks 130 of the stack structure 128 may exhibit substantially the same geometric configuration (e.g., substantially the same dimensions and substantially the same shape) as each other of the blocks 130, or one or more of the blocks 130 may exhibit a different geometric configuration (e.g., one or more different dimensions and/or a different shape) than one or more other of the blocks 130. In addition, each pair of horizontally neighboring blocks 130 of the stack structure 128 may be horizontally separated from one another by substantially the same distance (e.g., corresponding to a width in the Y-direction of each of the slot structures 132) as each other pair of horizontally neighboring blocks 130 of the stack structure 128, or at least one pair of horizontally neighboring blocks 130 of the stack structure 128 may be horizontally separated from one another by a different distance than that separating at least one other pair of horizontally neighboring blocks 130 of the stack structure 128. In some embodiments, the blocks 130 of the stack structure 128 are substantially uniformly (e.g., substantially non-variably, substantially equally, substantially consistently) sized, shaped, and spaced relative to one another.

Each of the blocks 130 of the stack structure 128 may be formed to include a vertically alternating (e.g., in a Z-direction) sequence of insulative structures 134 and conductive structures 136 arranged in tiers 138. For an individual block 130 of the stack structure 128, each of the tiers 138 may individually include one of the conductive structures 136 vertically neighboring (e.g., directly vertically adjacent) one of the insulative structures 134. The insulative structures 134 of the blocks 130 of the stack structure 128 may comprise portions of the insulative material 104 (FIGS. 3A and 3B) of the preliminary stack structure 102 (FIGS. 3A and 3B) remaining following the formation of the blocks 130. The conductive structures 136 of the blocks 130 of the stack structure 128 may comprise at least one conductive material formed (e.g., deposited) in place of the sacrificial material 106 (FIGS. 3A and 3B) of the preliminary stack structure 102 (FIGS. 3A and 3B) through the replacement gate process, as described in further detail below. The conductive material may formed of and include one or more of at least one conductively doped semiconductor material, at least one metal, at least one alloy, and at least one conductive metal-containing material (e.g., at least one conductive metal nitride, at least one conductive metal silicide, at least one conductive metal carbide, at least one conductive metal oxide). In some embodiments, the conductive structures 136 are formed of and include Tungsten (W). Optionally, at least one liner material (e.g., at least one insulative liner material, at least one conductive liner materials) may be formed around the conductive structures 136. The liner material may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material comprises at least one conductive material employed as a seed material for the formation of the conductive structures 136. In some embodiments, the liner material comprises titanium nitride ($TiN_x$, such as TiN). In further embodiments, the liner material further includes aluminum oxide ($AlO_x$, such as $Al_2O_3$). As a non-limiting example, for each of the block 130 of the stack structure 128, $AlO_x$ (e.g., $Al_2O_3$) may be formed directly adjacent the insulative structures 134, $TiN_x$ (e.g., TiN) may be formed directly adjacent the $AlO_x$, and Tungsten (W) may be formed directly adjacent the $TiN_x$. For clarity and ease of understanding the description, the liner material is not illustrated in FIGS. 5A-5C, but it will be understood that the liner material may be disposed around the conductive structures 136.

Within each block 130 of the stack structure 128, one or more conductive structures 136 of one or more relatively vertically higher tiers 138 (e.g., upper tiers) may be employed to form upper select gate structures (e.g., drain side select gate (SGD) structures) for upper select transistors (e.g., drain side select transistors) of the block 130. The conductive structures 136 of the relatively vertically higher tiers 138 may be segmented by one or more filled slot(s) (e.g., filled SGD slot(s)) to form the upper select gate structures of the block 130. In some embodiments, within each block 130 of the stack structure 128, the conductive structures 136 of each of less than or equal to eight (8) relatively higher tiers 138 (e.g., from one (1) relatively vertically higher tier 138 to eight (8) relatively vertically higher tiers 138) of the stack structure 128 is employed to form upper select gate structures (e.g., SGD structures) for the block 130. In addition, within each block 130 of the stack structure 128, the conductive structures 136 of at least some relatively vertically lower tiers 138 vertically underlying the relatively vertically higher tiers 138 may be employed to form access line structures (e.g., word line structures) of the block 130. Moreover, within each block 130 of the stack structure 128, the conductive structures 136 of at least a vertically lowest tier 138 may be employed to form as at least one lower select gate structure (e.g., at least one source side select gate (SGS) structure) for lower select transistors (e.g., source side select transistors) of the block 130.

To form the stack structure 128, including the blocks 130 thereof, slots (e.g., trenches, openings, apertures) having geometric configurations (e.g., shapes, dimensions) and positions corresponding to (e.g., substantially the same as) having geometric configurations (e.g., shapes, dimensions) and positions of the slot structures 132 may be formed in the preliminary stack structure 102 (FIGS. 3A and 3B). Thereafter, the microelectronic device structure 100 may be treated with at least one wet etchant formulated to selectively remove portions of the sacrificial material 106 (FIGS. 3A and 3B) of the tiers 108 (FIGS. 3A and 3B) of the preliminary stack structure 102 (FIGS. 3A and 3B) through the slots. The wet etchant may be selected to remove the portions of the sacrificial material 106 (FIGS. 3A and 3B) without substantially removing portions of the insulative material 104 (FIGS. 3A and 3B) of the tiers 108 (FIGS. 3A and 3B) of the preliminary stack structure 102 (FIGS. 3A and 3B), and without substantially removing portions of the dielectric barrier liner 120. During the material removal process, the dielectric barrier described above may protect (e.g., mask) the dielectric liner structures 121, the additional dielectric liner structures 122 and the dielectric fill material 124 from being removed. In some embodiments wherein the sacrificial material 106 (FIGS. 3A and 3B) comprises a dielectric nitride material (e.g., $SiN_y$, such as $Si_3N_4$) and the insulative material 104 and the dielectric barrier may comprise a dielectric oxide material (e.g., $SiO_x$, such as $SiO_2$), the sacrificial material 106 (FIGS. 3A and 3B) of the tiers 108 (FIGS. 3A and 3B) of the preliminary stack structure 102 (FIGS. 3A and 3B) is at selectively removed using a wet etchant comprising $H_3PO_4$. Following the selective removal of the portions of the sacrificial material 106 (FIGS. 3A and 3B), the resulting recesses may be filled with conductive material to form the conductive structures 136 of the blocks 130 of the stack structure 128. In addition, following the formation of the blocks 130, the slots between the blocks 130 may be filled (e.g., substantially filled) with at least one dielectric material (e.g., at least one dielectric oxide material, such as $SiO_x$; at least one dielectric nitride material, such as $SiN_y$) to form the slot structures 132. In some embodiments, the slot structures 132 are formed of and include $SiO_2$. The slot structures 132 may individually be formed to be substantially homogeneous, or may individually be formed to be heterogeneous.

Referring again to FIG. 5A, each block 130 of the stack structure 128 may individually be formed to include a row of the stadium structures 110 (e.g., including the first stadium structure 110A, the second stadium structure 110B, the third stadium structure 110C, and the fourth stadium structure 110D of the row), crest regions 140 (e.g., elevated regions), and bridge regions 142 (e.g., additional elevated regions). The stadium structures 110 may be distributed throughout and substantially confined within a horizontal area of the block 130. The crest regions 140 may be horizontally interposed between stadium structures 110 horizontally neighboring one another in the X-direction. The bridge regions 142 may horizontally neighbor opposing sides of individual stadium structures 110 in the Y-direction, and may horizontally extend from and between crest regions 140 horizontally neighboring one another in the X-direction. In FIG. 5A, for clarity and ease of understanding the drawings and associated description, portions (e.g., some of the bridge regions 142 horizontally neighboring first sides of the stadium structures 110 in the Y-direction) of one of the blocks 130 of the stack structure 128 are depicted as transparent to more clearly show the stadium structures 110 distributed within the block 130.

As shown in FIG. 5A, the crest regions 140 of an individual block 130 of the stack structure 128 may intervene between and separate stadium structures 110 horizontally neighboring one another in the X-direction. For example, one of the crest regions 140 may intervene between and separate the first stadium structure 110A and the second stadium structure 110B; an additional one of the crest regions 140 may intervene between and separate the second stadium structure 110B and the third stadium structure 110C; and a further one of the crest regions 140 may intervene between and separate the third stadium structure 110C and the fourth stadium structure 110D. A vertical height of the crest regions 140 in the Z-direction may be substantially equal to a maximum vertical height of the block 130 in the Z-direction; and a horizontal width of the crest regions 140 in the Y-direction may be substantially equal to a maximum horizontal width of the block 130 in the Y-direction. In addition, each of the crest regions 140 may individually exhibit a desired horizontal length in the X-direction. Each of the crest regions 140 of an individual block 130 of the stack structure 128 may exhibit substantially the same horizontal length in the X-direction as each other of the crest regions 140 of the block 130; or at least one of the crest regions 140 of the block 130 may exhibit a different horizontal length in the X-direction than at least one other of the crest regions 140 of the block 130.

Still referring to FIG. 5A, the bridge regions 142 of an individual block 130 of the stack structure 128 may be formed to intervene between and separate the stadium structures 110 of the block 130 from the slot structures 132 horizontally neighboring the block 130 in the Y-direction. For example, for each stadium structure 110 within an individual block 130 of the stack structure 128, a first bridge region 142A may be horizontally interposed in the Y-direction between a first side of the stadium structure 110 and a first of the slot structures 132 horizontally neighboring the block 130; and a second bridge region 142B may be horizontally interposed in the Y-direction between a second side of the stadium structure 110 and a second of the slot structures 132 horizontally neighboring the block 130. The first bridge region 142A and the second bridge region 142B may horizontally extend in parallel in the X-direction. In addition, the first bridge region 142A and the second bridge region 142B may each horizontally extend from and between crest regions 140 of the block 130 horizontally neighboring one another in the X-direction. The bridge regions 142 of the block 130 may be integral and continuous with the crest regions 140 of the block 130. Upper boundaries (e.g., upper surfaces) of the bridge regions 142 may be substantially coplanar with upper boundaries of the crest regions 140. A vertical height of the bridge regions 142 in the Z-direction may be substantially equal to a maximum vertical height of the block 130 in the Z-direction. In addition, each of the bridge regions 142 (including each first bridge region 142A and each second bridge region 142B) may individually exhibit a desired horizontal width in the Y-direction and a desired horizontal length in the X-direction. Each of the bridge regions 142 of the block 130 may exhibit substantially the same horizontal length in the X-direction as each other of the bridge regions 142 of the block 130; or at least one of the bridge regions 142 of the block 130 may exhibit a different horizontal length in the X-direction than at least one other of the bridge regions 142 of the block 130. In addition, each of the bridge regions 142 of the block 130 may exhibit substantially the same horizontal width in the Y-direction as each other of the bridge regions 142 of the block 130; or at least one of the bridge regions 142 of the block 130 may exhibit a different horizontal width in the Y-direction than at least one other of the bridge regions 142 of the block 130.

For each block 130 of the stack structure 128, the bridge regions 142 thereof horizontally extend around the filled trenches 126 of the block 130. Some of the bridge regions 142 of the block 130 may be employed to form continuous conductive paths extending from and between horizontally neighboring crest regions 140 of the block 130. As shown in FIG. 5C, the dielectric barrier liner 120 of the filled trenches 126 may be positioned directly horizontally adjacent (e.g., in the Y-direction) inner side surfaces (e.g., inner sidewalls) of the bridge regions 142, and the slot structures 132 may be positioned directly horizontally adjacent (e.g., in the Y-direction) outer side surfaces (e.g., outer sidewalls) of the bridge regions 142. A first dielectric liner structure 121A may be positioned directly horizontally adjacent (e.g., in the Y-direction) and may substantially cover inner side surfaces (e.g., inner sidewalls) of the vertically extending portions of dielectric barrier liner 120. A first additional dielectric liner structure 122 may then be positioned directly horizontally adjacent (e.g., in the Y-direction) and may substantially cover inner side surfaces of the dielectric liner structure 121A. The first additional dielectric liner structures 122 may be followed by a second dielectric liner structure 121B and the pattern may repeat through all the dielectric liner structures 121 and additional dielectric liner structures 122. The dielectric fill material 124 may then be positioned directly horizontally adjacent (e.g., in the Y-direction) and may substantially cover inner side surfaces (e.g., inner sidewalls) of the final dielectric liner structure 121E and may fill the rest of the filled trench 126. In addition, for each filled trench 126, the dielectric barrier liner 120 is vertically interposed between boundaries of the steps 116 of the stadium structure 110 partially defining the filled trench 126 and lower boundaries of the alternating sequence of the dielectric liner structures 121 and the additional dielectric liner structures 122.

Figure 5C:
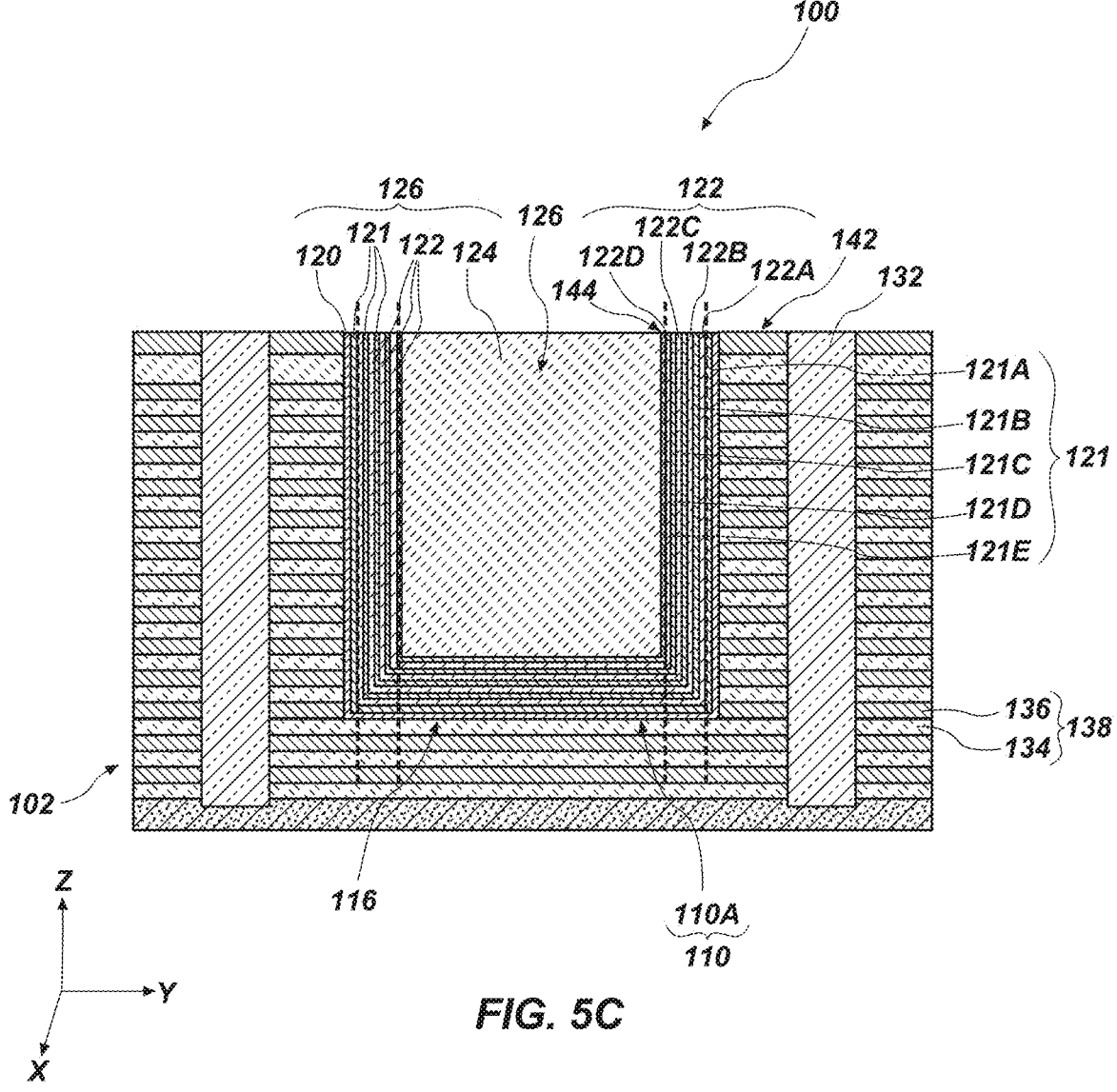
FIG. 5C is a simplified, partial longitudinal cross-sectional view of a portion of the microelectronic device structure at the processing stage of FIGS. 5A and 5B about a dashed line B-B shown in FIG. 5B.

Still referring to FIG. 5C, each block 130 of the stack structure 128 may individually be formed to have a desired distribution of contact structures 144 (e.g., support contact structures) (depicted by way of dashed lines in FIG. 5C)

vertically extending therethrough. The contact structures 144 may, for example, be formed in the preliminary stack structure 102 (FIGS. 3A and 3B) prior to the replacement gate processing to form the conductive structures 136 of the blocks 130 of the stack structure 128. The contact structures 144 may be configured and positioned to facilitate support of the insulative material 104 (FIGS. 3A and 3B) of each of the tiers 108 (FIGS. 3A and 3B) of the preliminary stack structure 102 (FIGS. 3A and 3B) during replacement of the sacrificial material 106 (FIGS. 3A and 3B) of the tiers 108 (FIGS. 3A and 3B) with the conductive structures 136. In some embodiments, each block 130 of the stack structure 128 includes at least one array of the contact structures 144 vertically extending therethrough, including rows of the contact structures 144 extending in the X-direction, and columns of the contact structures 144 extending to the Y-direction. For each block 130, portions of the at least one array of the contact structures 144 may be located within horizontal areas of the stadium structures 110 within the block 130.

The contact structures 144 may each individually be formed to exhibit a desired horizontal cross-sectional shape. In some embodiments, each of the contact structures 144 is formed to exhibit a substantially circular horizontal cross-sectional shape. In additional embodiments, one or more (e.g., each) of the contact structures 144 exhibits a non-circular cross-sectional shape, such as one of more of a square cross-sectional shape, a rectangular cross-sectional shape, an oblong cross-sectional shape, an elliptical cross-sectional shape, a tear drop cross-sectional shape, a semi-circular cross-sectional shape, a tombstone cross-sectional shape, a crescent cross-sectional shape, a triangular cross-sectional shape, a kite cross-sectional shape, and an irregular cross-sectional shape. In addition, each of the contact structures 144 may be formed to exhibit substantially the same horizontal cross-sectional dimensions (e.g., substantially the same horizontal diameter), or at least one of the contact structures 144 may be formed to exhibit one or more different horizontal cross-sectional dimensions (e.g., a different horizontal diameter) than at least one other of the contact structures 144. In some embodiments, all of the contact structures 144 are formed to exhibit substantially the same horizontal cross-sectional dimensions.

The contact structures 144 may be formed within horizontal areas of the stadium structures 110 by removing (e.g., etching) portions of the dielectric fill material 124, the additional dielectric liner structures 122, the dielectric liner structures 121, the dielectric barrier liner 120, and the preliminary stack structure 102 to form contact openings. The material removal process may remove some materials faster than others. For example, material of the dielectric liner structures 121 may be removed at a slower rate than the materials of the dielectric fill material 124, additional dielectric liner structures 122, and the dielectric barrier liner 120. Thicknesses of the additional dielectric liner structures 122, the dielectric liner structures 121, and the dielectric barrier liner 120 may be selected to achieve desirable etching results. For example, smaller thicknesses 402 of the dielectric liner structures 121 relative to thicknesses of 404 of the additional dielectric liner structures 122 and the thickness 406 of the dielectric barrier liner 120 may promote etch consistency and desirable geometric configurations of resulting contact openings to contain the contact structures 144. When an etchant encounters a relatively more etch resistant material, such as material of the dielectric liner structures 121, the etchant may favor removal the additional dielectric liner structures 122, dielectric fill material 124 and the dielectric barrier liner 120, which may affect the geometric configurations of the resulting contact openings to contain the contact structures 144.

In conventional filled trench configurations having a single thick dielectric liner structure over a dielectric barrier liner, the tendency of the etchant to favor removal of the material of dielectric fill material over the material of the single thick dielectric liner structure may cause a resulting opening to curve or bend, resulting in a non-uniform opening that may not terminate at the desired location. A curving opening may also result in a contact structure contained within and at least partially defined by the contact opening passing into a portion of the filled trench where an additional contact structure will pass at a later processing stage, as described below. This may cause a cross-connection of contact structures, which may result in a failed component. The configurations of the dielectric liner structures 121 of the disclosure may reduce the amount of time that an etchant is interacting with a relatively more etch resistant material relative to conventional filled-trench configurations, such as those employing a single, relatively thick dielectric nitride structure as an etch stop material. This may enhanced etch consistency relative to conventional methods and mitigation of undesirable vertical curvature (e.g., bending) in the resulting contact openings. Thus, the contact structures 144 may be formed to exhibit less bending in a vertical direction (e.g., the Z-direction) relative to conventional contact structures.

In some embodiments, the contact structures 144 are each individually formed of and include at least one conductive material, such as one or more of at least one metal (e.g., W, Ti, Mo, Nb, V, Hf, Ta, Cr, Zr, Fe, Ru, Os, Co, Rh, Jr, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), at least one conductive metal-containing material (e.g., a conductive metal nitride, a conductive metal silicide, a conductive metal carbide, a conductive metal oxide), and at least one conductively-doped semiconductor material (e.g., conductively-doped Si, conductively-doped Ge, conductively-doped SiGe). In addition, at least one insulative liner material may be formed to substantially surround (e.g., substantially horizontally and vertically cover) side surfaces (e.g., sidewalls) of each of the contact structures 144. The insulative liner material may be horizontally interposed between the contact structures 144 and the tiers 138 of the blocks 130 of the stack structure 128. The insulative liner material may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_{-x}$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_z\ N_y$), and amorphous carbon. In some embodiments, the insulative liner material comprises $SiO_2$. In additional embodiments, one or more of the contact structures 144 are formed to be substantially free of conductive material. For example, one or more of the contact structures 144 may be formed of and include dielectric material and/or semiconductive material.

Figure 6A:
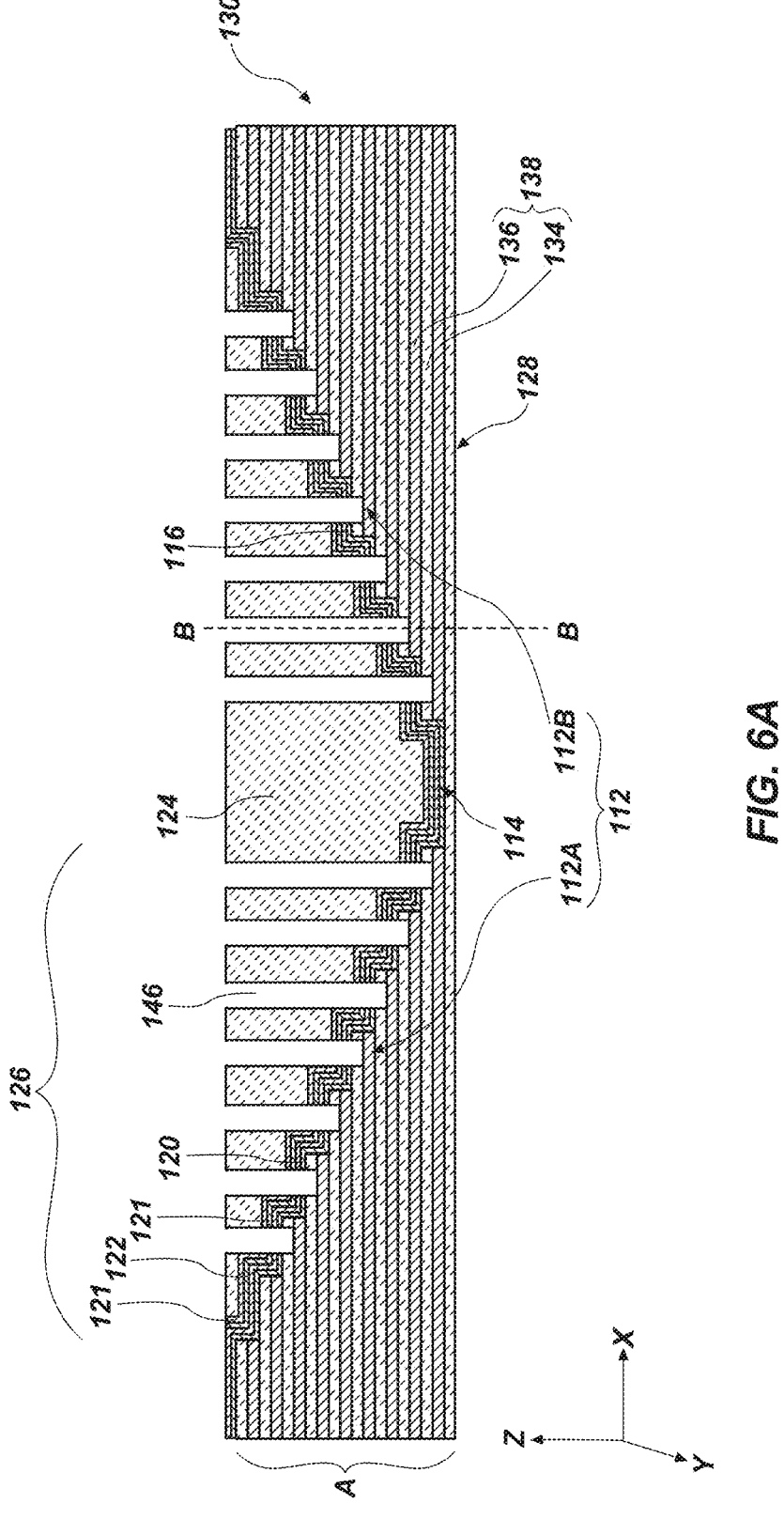
FIG. 6A is a simplified, longitudinal cross-sectional view of the portion A of the microelectronic device structure shown in FIGS. 1A through 1C at another processing stage of the method forming the microelectronic device following the processing stage of FIGS. 5A and 5B.
Figure 6B:
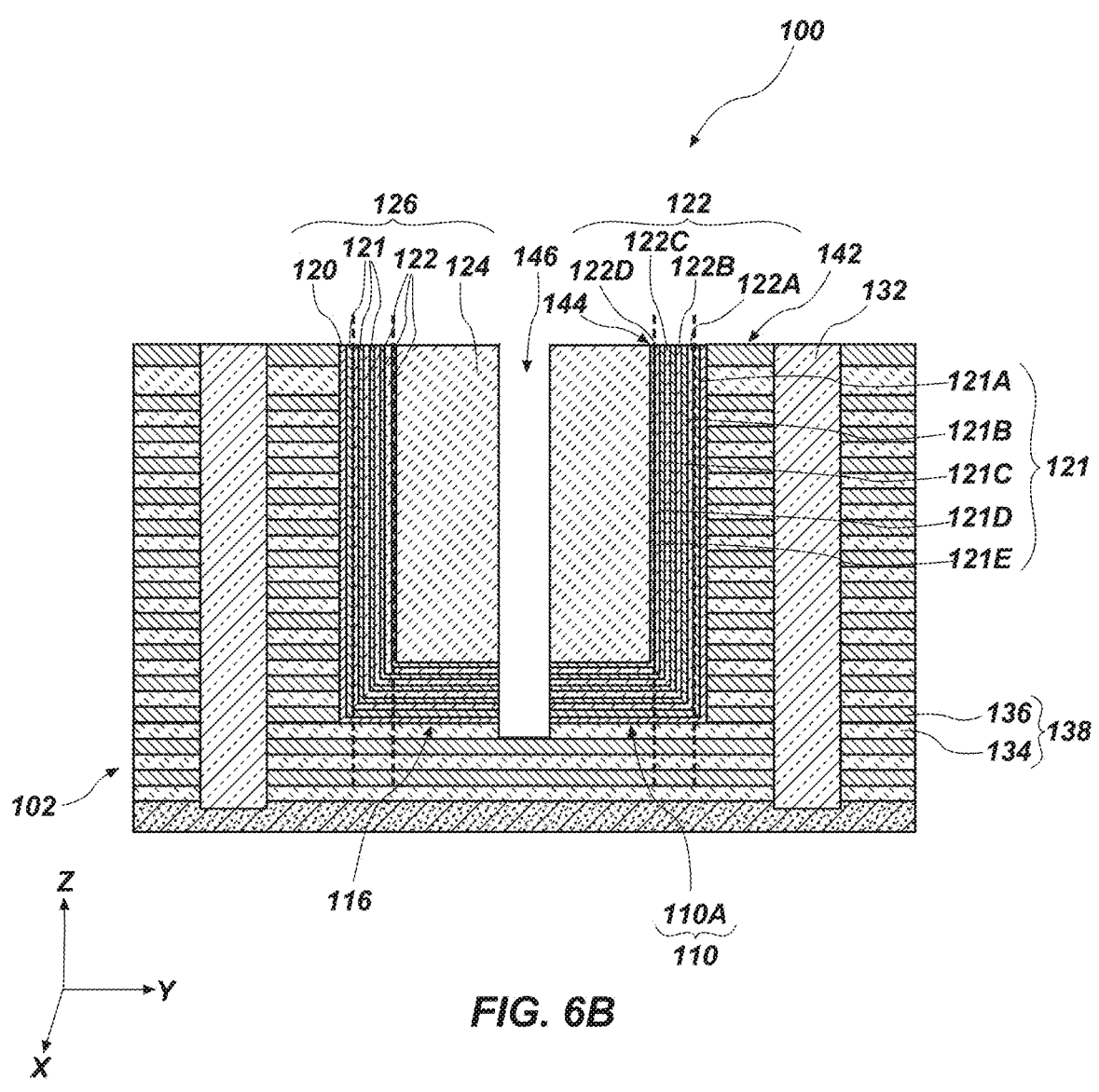
FIG. 6B is a simplified, partial longitudinal cross-sectional view of a portion of the microelectronic device structure at the processing stage of FIG. 6A about the dashed line B-B shown in FIG. 6A.

Referring next to FIG. 6A, which is a simplified, longitudinal cross-sectional view of the portion A of the microelectronic device structure 100 following the processing stage previously described with reference to FIGS. 5A through 5C, for each block 130 of the stack structure 128, portions of at least the dielectric fill material 124, the dielectric liner structures 121, the additional dielectric liner structures 122, and the dielectric barrier liner 120 are removed (e.g., etched) to form contact openings 146 (e.g., apertures, vias) vertically extending (e.g., in the Z-direction) therethrough. In some embodiments, the contact openings 146 may also individually vertically extend through an insulative structure 134 of a tier 138 of the block 130. The contact openings 146 may vertically extend to or into the conductive structures 136 of the tiers 138 at the steps 116 of one or more (e.g., each) of the stadium structures 110, such as steps 116 of the forward staircase structure 112A of one or more of the stadium structures 110 and/or steps 116 of the reverse staircase structure 112B of one or more of the stadium structures 110. A bottom (e.g., lower vertical end) of each contact opening 146 may expose and be defined by a surface of the conductive structure 136 of an individual tier 138 of the stack structure 128 at an individual step 116 of an individual stadium structure 110 of an individual block 130 of the stack structure 128. FIG. 6B is a simplified, partial longitudinal cross-sectional view of a portion of the microelectronic device structure 100 at the processing stage of FIG. 6A about a dashed line B-B shown in FIG. 6A.

Within each block 130 of the stack structure 128, each contact opening 146 may be formed at a desired horizontal position (e.g., in the X-direction and the Y-direction) on or over one of the steps 116 of one of the stadium structures 110. In some embodiments, within a horizontal area of one or more of the stadium structures 110, at least some of the contact openings 146 are horizontally offset in the Y-direction from at least some other of the contact openings 146. In FIG. 6A, such horizontal offset is depicted by way of dashed lines at the boundaries (e.g., horizontal boundaries, vertical boundaries) of the contact openings 146. In addition, individual steps 116 of an individual stadium structure 110 (e.g., individual steps 116 of the forward staircase structure 112A thereof, individual steps 116 of the reverse staircase structure 112B thereof) may have a single (e.g., only one) contact opening 146 vertically extending thereto, may have multiple (e.g., more than one) contact openings 146 vertically extending thereto, or may have no contact openings 146 vertically extending thereto.

The contact openings 146 may each individually be formed to exhibit a desired horizontal cross-sectional shape. In some embodiments, each of the contact openings 146 is formed to exhibit a substantially circular horizontal cross-sectional shape. In additional embodiments, one or more (e.g., each) of the contact openings 146 exhibits a non-circular cross-sectional shape, such as one more of an oblong cross-sectional shape, an elliptical cross-sectional shape, a square cross-sectional shape, a rectangular cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the contact openings 146 may be formed to exhibit substantially the same horizontal cross-sectional dimensions (e.g., substantially the same horizontal diameter), or at least one of the contact openings 146 may be formed to exhibit one or more different horizontal cross-sectional dimensions (e.g., a different horizontal diameter) than at least one other of the contact openings 146. In some embodiments, all of the contact openings 146 are formed to exhibit substantially the same horizontal cross-sectional dimensions.

The contact openings 146 may be formed using one or more material removal acts (e.g., etching acts, anisotropic dry etching acts). In some embodiments, multiple material removal acts (e.g., multiple etching acts) are employed. For example, a first etching act result in initial contact openings stopping at relatively higher dielectric liner structures 121 or relatively higher additional dielectric liner structures 122 within the filled trenches 126, and this at least one additional first etching act may be performed to vertically extend the initial contact openings through the remaining dielectric liner structures 121, additional dielectric liner structures 122, and dielectric barrier liner 120 and form the contact openings 146. Each contact opening 146 may individually expose a portion of a conductive structure 136 of a tier 138 of the stack structure 128 at a step 116 of an individual staircase structure 112.

In conventional filled trench configurations having a single thick dielectric liner structure 121 over the dielectric barrier liner 120, the increased etch resistivity of the single thick dielectric liner structure 121 relative to the dielectric fill material 124 may cause the material removal act used to form the contact openings 146 to stop. For example, if the material removal acts line up with a vertical portion of the single thick dielectric liner structure 121, such as a portion of the single thick dielectric liner structure 121 positioned over a vertical portion of an adjacent step 116, may cause sufficient resistance to the material removal act so as to stop the material removal act before the associated contact opening 146 reaches the desired depth. As described above, the configurations of the dielectric liner structures 121 of the disclosure may reduce the amount of time that an etchant is interacting with a relatively more etch resistant material relative to conventional filled-trench configurations, such as those employing a single, relatively thick dielectric nitride structure as an etch stop material. This may substantially reduce the likelihood of the material removal process stopping before reaching the desired depth to form the contact openings 146.

Furthermore, as described above the tendency of the etchant to favor removal of the material of dielectric fill material over the material of the dielectric liner structures may direct the material removal act and shape the resulting opening. Therefore, when approaching the associated steps 116, the material removal process may effectively be confined between neighboring vertically extending portions of the dielectric liner structures 121 having a higher etch resistance than the intervening additional dielectric liner structures 122, such that the material removal process may remove the additional dielectric liner structures 122 having a lower etch resistance between the dielectric liner structures 121 in the vertically extending region and be directed (e.g., steered) by the vertically extending portions of the neighboring dielectric liner structures 121. Thus, the neighboring dielectric liner structures 121 may effectively direct the material removal process to a desired location on the associated step 116. In other words, the vertically extending portions of the neighboring dielectric liner structures 121 may effectively align the resulting contact openings 146 with the respective steps 116.

Figure 7A:
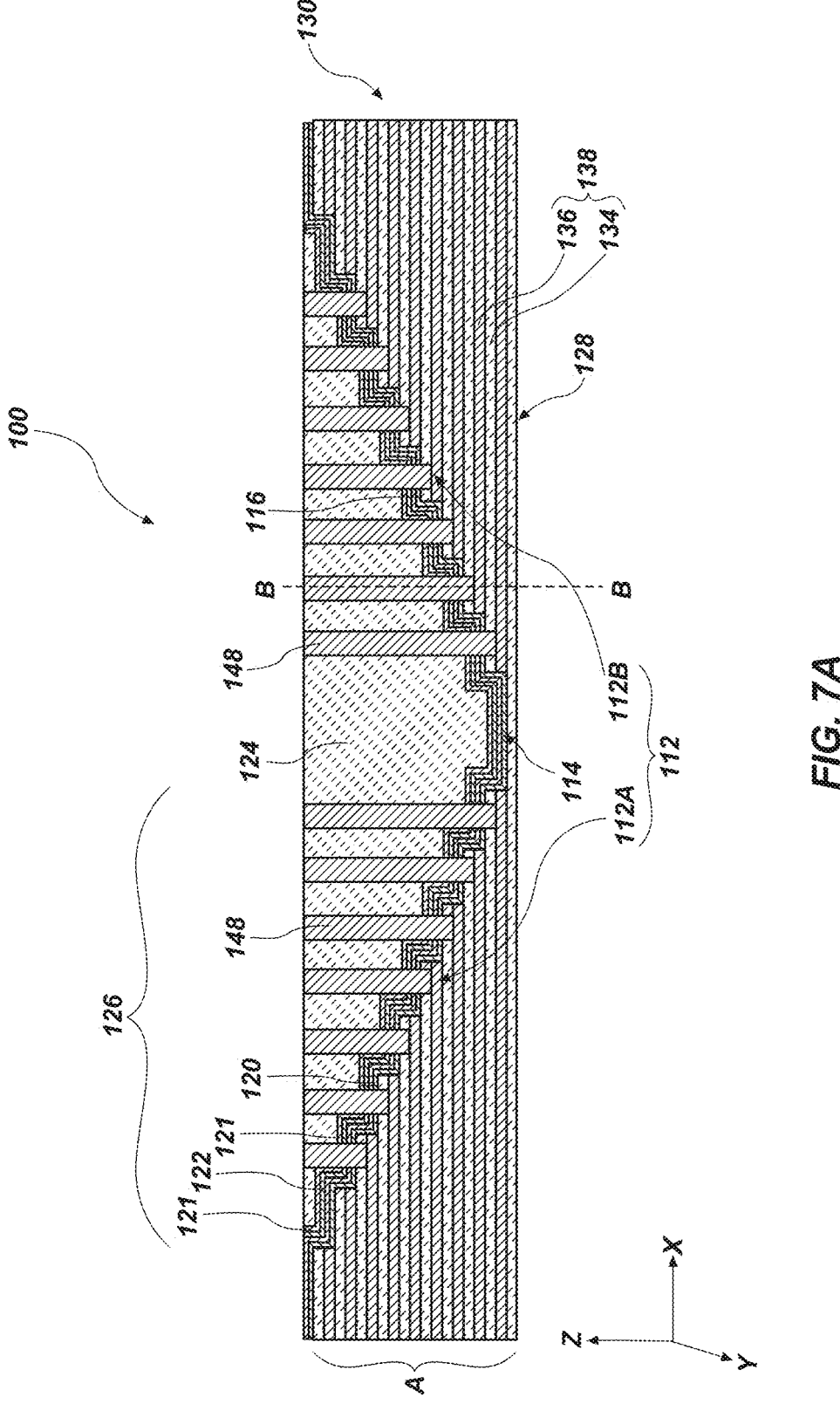
FIG. 7A is a simplified, longitudinal cross-sectional view of the portion A of the microelectronic device structure shown in FIGS. 1A through 1C at another processing stage of the method forming the microelectronic device following the processing stage of FIGS. 6A and 6B.

Referring next to FIG. 7A, which is a simplified, longitudinal cross-sectional view of the portion A of the microelectronic device structure 100 following the processing stage previously described with reference to FIGS. 6A and 6B, contact structures 148 may be formed within the contact openings 146 (FIGS. 6A and 6B). The contact structures 148 may be substantially confined within boundaries (e.g., horizontal boundaries, vertical boundaries) of the contact openings 146 (FIGS. 6A and 6B), and may substantially fill the contact openings 146 (FIGS. 6A and 6B). Each contact structure 148 may have a geometric configuration (e.g., shape, dimensions) corresponding to (e.g., substantially the same as) a geometric configuration of the contact opening 146 (FIGS. 6A and 6B) filled with the contact structure 148. As shown in FIG. 7A, each contact structure 148 may have an uppermost vertical boundary (e.g., an uppermost surface) substantially coplanar with an uppermost vertical boundary (e.g., an uppermost surface) of the dielectric fill material 124, and a lowermost vertical boundary (e.g., a lowermost surface) vertically adjacent an uppermost vertical boundary (e.g., an uppermost surface) of the conductive structure 136 of an individual tier 138 of an individual block 130 the stack structure 128. In additional embodiments, one or more (e.g., each) of the contact structures 148 may have an uppermost vertical boundary offset from (e.g., vertically over, vertically under) an uppermost vertical boundary (e.g., an uppermost surface) of the dielectric fill material 124. Each contact structure 148 may individually contact (e.g., physically contact, electrically contact) the conductive structure 136 of the individual tier 138 of the stack structure 128 at an individual step 116 of an individual stadium structure 110 of an individual block 130 of the stack structure 128.

The contact structures 148 may be formed of and include conductive material. As a non-limiting example, the contact structures 148 may be formed of and include one or more of at least one metal, at least one alloy, and at least one conductive metal-containing material (e.g., a conductive metal nitride, a conductive metal silicide, a conductive metal carbide, a conductive metal oxide). A material composition of the contact structures 148 may be substantially the same as a material composition of the conductive structures 136 of the tiers 138 of the blocks 130 of the stack structure 128, or the material composition of the contact structures 148 may be different than the material composition of the conductive structures 136 of the tiers 138 of the blocks 130 of the stack structure 128. In some embodiments, the contact structures 148 are individually formed of and include tungsten (W). The contact structures 148 may individually be homogeneous, or the contact structures 148 may individually be heterogeneous.

The contact structures 148 may be formed by forming (e.g., non-conformably depositing, such as through one or more of a PVD process and a non-conformal CVD process) conductive material inside and outside of the contact openings 146 (FIGS. 6A and 6B), and then removing (e.g., through an abrasive planarization process, such as a CMP process) portions of the conductive material overlying an uppermost vertical boundary (e.g., an uppermost surface) of the dielectric fill material 124.

Thus, in accordance with embodiments of the disclosure, a microelectronic device includes a stack structure. The stack structure includes blocks separated from one another by dielectric slot structures and each including a vertically alternating sequence of conductive structures and insulative structures arranged in tiers. At least one of the blocks includes two crest regions, a stadium structure interposed between the two crest regions in a first horizontal direction and opposing staircase structures each having steps comprising edges of the tiers. The at least one of the blocks further including two bridge regions neighboring opposing sides of the stadium structure in a second horizontal direction orthogonal to the first horizontal direction and having upper surfaces substantially coplanar with upper surfaces of the two crest regions. The microelectronic device further includes a filled trench vertically overlying and within horizontal boundaries of the stadium structure of the at least one of the blocks. The filled trench includes dielectric liner structures comprising dielectric material. The filled trench further includes additional dielectric liner structures alternating with the dielectric liner structures and comprising additional dielectric material have a different material composition than that of the dielectric material. The filled trench also includes dielectric fill material overlying an alternating sequence of the dielectric liner structures and additional dielectric liner structures.

Furthermore, in accordance with embodiments of the disclosure a method of forming a microelectronic device includes forming a preliminary stack structure including a vertically alternating sequence of sacrificial material and insulative material arranged in tiers. The preliminary stack structure further including a stadium structure including opposing staircase structures having steps including edges of the tiers of the preliminary stack structure. The method further includes forming a filled trench vertically over and within a horizontal area of the stadium structure. The filled trench including a first dielectric liner structure comprising a first dielectric material extending continuously over surfaces of the preliminary stack structure within the horizontal area of the stadium structure. The filled trench further including a second dielectric liner structure comprising a second dielectric material having a different material composition than the first dielectric material extending continuously over surfaces of the first dielectric liner structure. The filled trench also including a third dielectric liner structure comprising the first dielectric material extending continuously over surfaces of the second dielectric liner structure. The filled trench further including a fourth dielectric liner structure comprising the second dielectric material extending continuously over surfaces of the third dielectric liner structure. The filled trench also including a dielectric fill material overlying the fourth dielectric liner structure. The filled trench further including a second dielectric fill material over the second dielectric liner material. The method also includes forming contact structures within the horizontal area of the stadium structure, the contact structures vertically extending completely through the filled trench and each of the tiers of the preliminary stack structure underlying the filled trench. The method further includes replacing the sacrificial material of the tiers of the preliminary stack structure with conductive material after forming the contact structures.

Figure 7B:
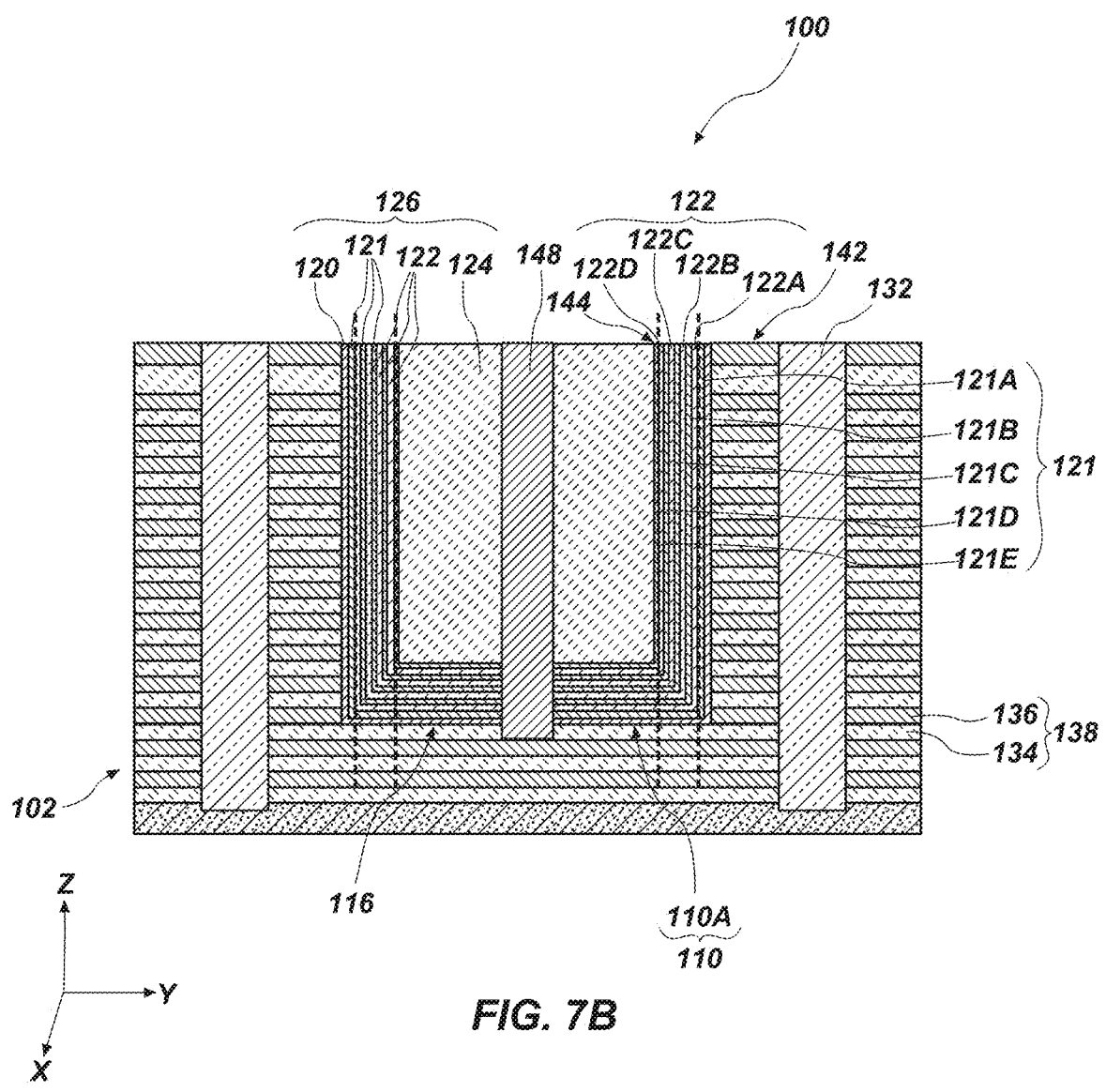
FIG. 7B is a simplified, partial longitudinal cross-sectional view of a portion of the microelectronic device structure at the processing stage of FIG. 7A about the dashed line B-B shown in FIG. 7A.
Figure 8:
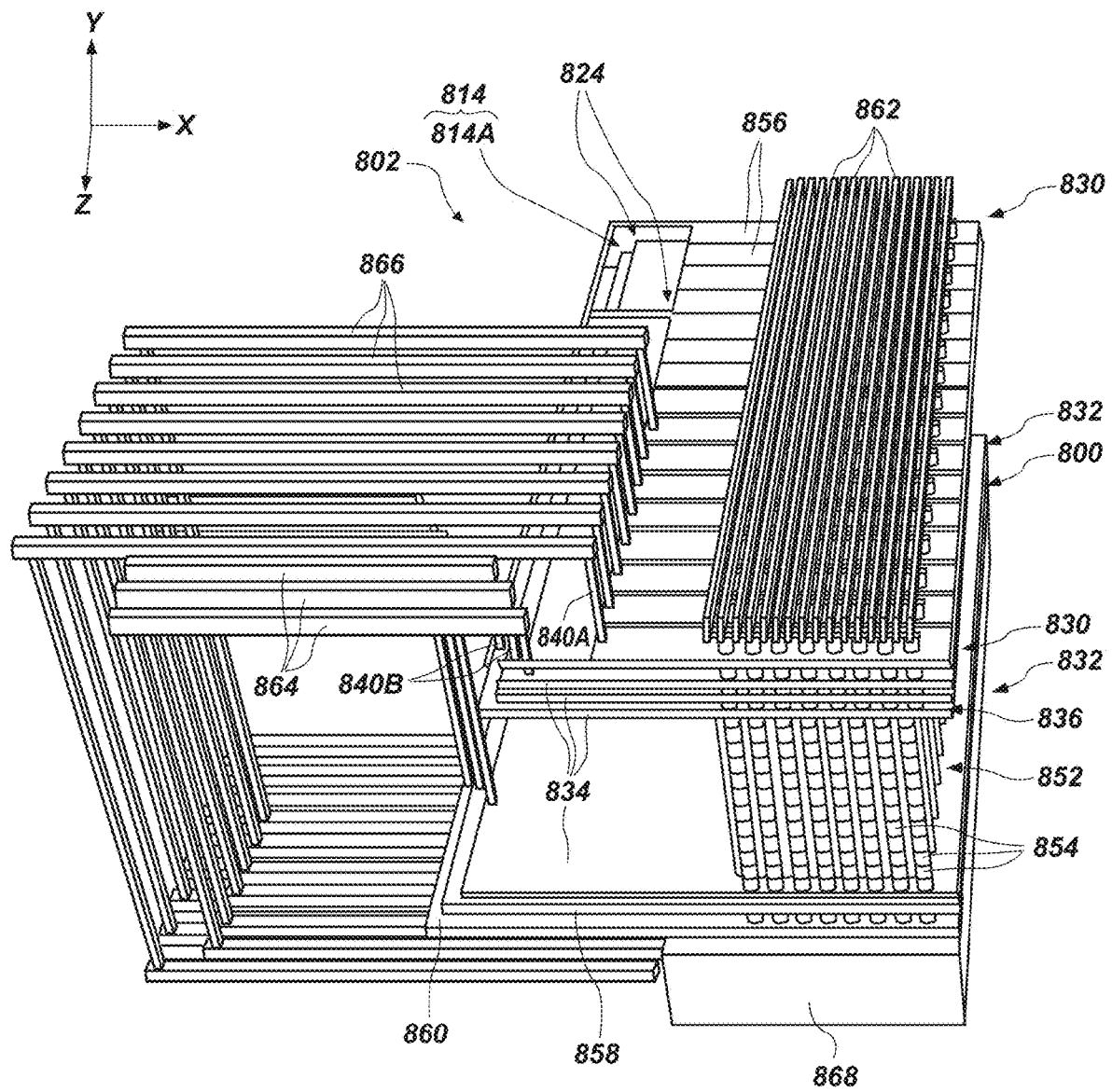
FIG. 8 is a simplified partial cutaway perspective view of a microelectronic device, in accordance with embodiments of the disclosure.

Microelectronic device structures (e.g., the microelectronic device structures 100 previously described with reference to FIGS. 7A and 7B) of the disclosure may be included in microelectronic devices of the disclosure. For example, FIG. 8 illustrates a partial cutaway perspective view of a portion of a microelectronic device 802 (e.g., a memory device, such as a 3D NAND Flash memory device) including a microelectronic device structure 800. The microelectronic device structure 800 may be substantially similar to one of the microelectronic device structures 100, previously described with reference to FIGS. 7A and 7B. For clarity and ease of understanding the drawings and associated description, some features (e.g., structures, materials) of the microelectronic device structures 100 previously described herein are not shown in FIG. 8. However, it will be understood that any features of the microelectronic device structures 100 previously described with reference to one or more of FIGS. 7A and 7B may be included in the microelectronic device structure 800 of the microelectronic device 802 described herein with reference to FIG. 8.

As shown in FIG. 8, in addition to the features of the microelectronic device structure 800 previously described herein in relation to one or more of the microelectronic device structures 100 (FIGS. 7A and 7B), the microelectronic device 802 may further include cell pillar structures 852 vertically extending through each block 830 of the stack structure 832. The cell pillar structures 852 may be positioned within regions (e.g., memory array regions) of the block 830 horizontally offset (e.g., in the X-direction) from the stadium structures 814 (e.g., the first stadium structure 814A) (and, hence, the bridge regions 824) within the blocks 830. Intersections of the cell pillar structures 852 and the conductive material 834 of the tiers 836 of the stack structure 832 within the horizontal areas of the blocks 830 form strings of memory cells 854 vertically extending through each block 830 of the stack structure 128. For each string of memory cells 854, the memory cells 854 thereof may be coupled in series with one another. Within each block 830, the conductive material 834 of some of the tiers 836 of the stack structure 832 may serve as access line structures (e.g., word line structures) for the strings of memory cells 854 within the horizontal area of the block 830. In some embodiments, within each block 830, the memory cells 854 formed at the intersections of the conductive material 834 of some of the tiers 836 and the cell pillar structures 852 comprise so-called "MONOS" (metal-oxide-nitride-oxide-semiconductor) memory cells. In additional embodiments, the memory cells 854 comprise so-called "TANOS" (tantalum-nitride-aluminumoxide-nitride-oxide-semiconductor) memory cells, or so-called "BETANOS" (band/barrier engineered TANOS) memory cells, each of which are subsets of MONOS memory cells. In further embodiments, the memory cells 854 comprise so-called "floating gate" memory cells including floating gates (e.g., metallic floating gates) as charge storage structures. The floating gates may horizontally intervene between central structures of the cell pillar structures 852 and the conductive material 834 of the different tiers 836 of the stack structure 832.

The microelectronic device 802 may further include at least one source structure 860, access line routing structures 864, first select gates 856 (e.g., upper select gates, drain select gates (SGDs)), select line routing structures 866, one or more second select gates 858 (e.g., lower select gates, source select gate (SGSs)), and digit line structures 862. The digit line structures 862 may vertically overlie and be coupled to the cell pillar structures 852 (and, hence, the strings of memory cells 854). The source structure 860 may vertically underlie and be coupled to the cell pillar structures 852 (and, hence, the strings of memory cells 854). In addition, the first contact structures 840A (e.g., select line contact structures) and the second contact structures 840B (e.g., access line contact structures) may couple various features of the microelectronic device 802 to one another as shown (e.g., the select line routing structures 866 to the first select gates 856; the access line routing structures 864 to the conductive materials 834 of the tiers 836 of the stack structure 832 underlying the first select gates 856 and defining access line structures of the microelectronic device 802).

The microelectronic device 802 may also include a base structure 868 positioned vertically below the cell pillar structures 852 (and, hence, the strings of memory cells 854). The base structure 868 may include at least one control logic region including control logic devices configured to control various operations of other features (e.g., the strings of memory cells 854) of the microelectronic device 802. As a non-limiting example, the control logic region of the base structure 868 may further include one or more (e.g., each) of charge pumps (e.g., VCCP charge pumps, VNEGWL charge pumps, DVC2 charge pumps), delay-locked loop (DLL)

circuitry (e.g., ring oscillators), Vdd regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 868 may be coupled to the source structure 860, the access line routing structures 864, the select line routing structures 866, and the digit line structures 862. In some embodiments, the control logic region of the base structure 868 includes CMOS (complementary metal-oxide-semiconductor) circuitry. In such embodiments, the control logic region of the base structure 868 may be characterized as having a "CMOS under Array" ("CuA") configuration.

Thus, in accordance with embodiments of the disclosure a memory device includes a stack structure comprising tiers each comprising a conductive material and an insulative material vertically neighboring the conductive material, the stack structure divided into blocks extending in parallel in a first direction and separated from one another in a second direction by dielectric slot structures, each of the blocks comprising a stadium structure comprising opposing staircase structures individually having steps comprising horizontal ends of at least some of the tiers of the stack structure. The memory device further includes filled trenches within the blocks of the stack structure, each of the filled trenches vertically over and within a horizontal area of the stadium structure of one of the blocks of the stack structure. The filled trenches including an alternating sequence of dielectric liner structures and additional dielectric liner structures, the dielectric liner structures having a different material composition than the additional dielectric liner structures. The filled trenches further including a dielectric fill material vertically overlying and horizontally surrounded by the alternating sequence of the dielectric liner structures and the additional dielectric liner structures. The memory device further includes strings of memory cells vertically extending through a portion of each of the blocks neighboring the stadium structure in the first direction.

Figure 9:
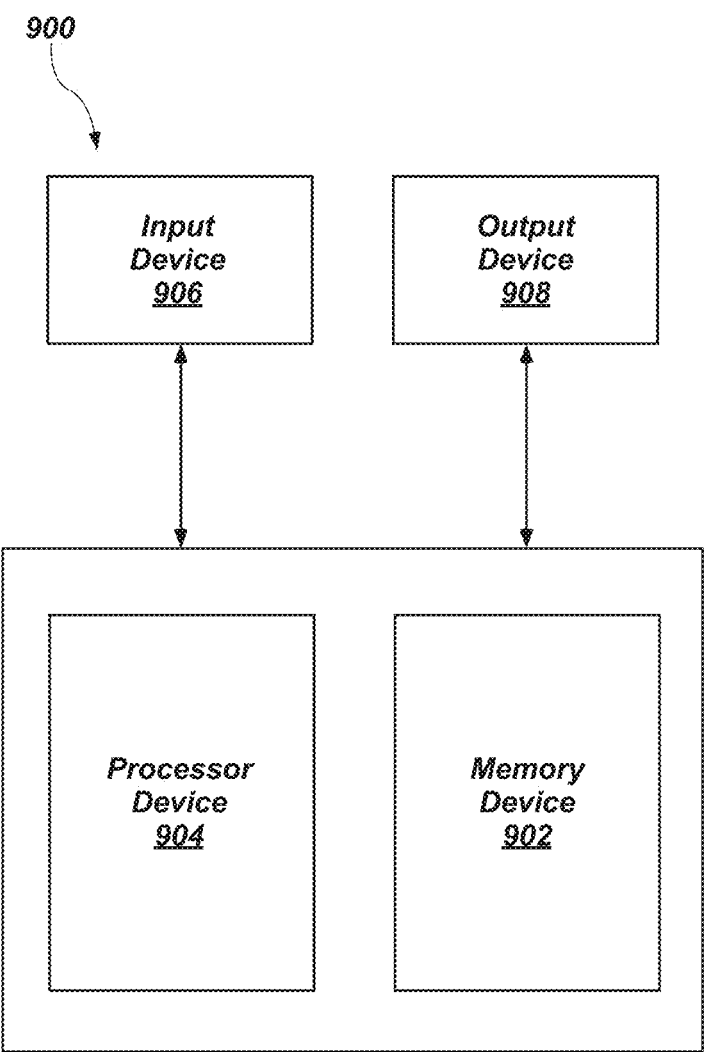
FIG. 9 is a schematic block diagram of an electronic system in accordance with one or more embodiments of the disclosure.

Microelectronic devices (e.g., the microelectronic device 802 (FIG. 8) and microelectronic device structures (e.g., the microelectronic device structure 100 (FIGS. 7A and 7B), the microelectronic device structure 800 (FIG. 8)) including the stacked structures of the disclosure) may be included in embodiments of electronic systems of the disclosure. For example, FIG. 9 is a block diagram of an electronic system 900, in accordance with embodiments of the disclosure. The electronic system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 900 includes at least one memory device 902. The memory device 902 may include, for example, an embodiment of one or more of a microelectronic device (e.g., the microelectronic device 802 (FIG. 8) and a microelectronic device structure (e.g., the microelectronic device structure 100 (FIGS. 7A and 7B), the microelectronic device structure 800 (FIG. 8)) previously described herein.

The electronic system 900 may further include at least one electronic signal processor device 904 (often referred to as a "microprocessor"). The electronic signal processor device 904 may, optionally, include an embodiment of one or more of a microelectronic device (e.g., the microelectronic device 802 (FIG. 8) and a microelectronic device structure (e.g., the microelectronic device structure 100 (FIGS. 7A and 7B)), the microelectronic device structure 800 (FIG. 8)) previously described herein. The electronic system 900 may further include one or more input devices 906 for inputting information into the electronic system 900 by a user, such as, for example, a mouse or other pointing device, a keyboard, a touchpad, a button, or a control panel. The electronic system 900 may further include one or more output devices 908 for outputting information (e.g., visual or audio output) to a user such as, for example, a monitor, a display, a printer, an audio output jack, a speaker, etc. In some embodiments, the input device 906 and the output device 908 may comprise a single touchscreen device that can be used both to input information to the electronic system 900 and to output visual information to a user. The input device 906 and the output device 908 may communicate electrically with one or more of the memory device 902 and the electronic signal processor device 904.

Thus, embodiments of the disclosure include an electronic system. The electronic system includes an input device, an output device, a processor device operably coupled to the input device and the output device, and a memory device operably coupled to the processor device and comprising at least one microelectronic device structure. The memory device structure including a stack structure having a vertically alternating sequence of conductive material and insulative material arranged in tiers, the stack structure comprising at least two blocks separated from one another by at least one dielectric structure. Each of the at least two blocks including two elevated regions. Each of the at least two blocks further including a stadium structure interposed between the two elevated regions in a first horizontal direction and comprising staircase structures opposing one another in the first horizontal direction, the staircase structures each having steps comprising edges of the tiers of the stack structure. Each of the at least two blocks also including two additional elevated regions neighboring opposing sides of the stadium structure in a second horizontal direction perpendicular to the first horizontal direction. The memory device structure further including filled trenches over and within horizontal boundaries of the at least two blocks of the stack structure. Each of the filled trenches including an alternating sequence of dielectric nitride liners and dielectric oxide liners continuously extending over surfaces of the stadium structure, the two elevated regions, and the two additional elevated regions of one of the at least two blocks of the stack structure. Each of the filled trenches further including dielectric fill material over the alternating sequence of the dielectric nitride liners and the dielectric oxide liners. The memory device structure also including conductive contact structures vertically extending completely through the filled trenches.

The structures, devices, system, and methods of the disclosure advantageously facilitate one or more of improved microelectronic device performance, reduced costs (e.g., manufacturing costs, material costs), increased miniaturization of components, and greater packaging density as compared to conventional structures, conventional devices, conventional systems, and conventional methods. The structures, devices, systems, and methods of the disclosure may also improve scalability, efficiency, and simplicity as compared to conventional structures, conventional devices, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment of the disclosure may be combined with elements and features disclosed in relation to other embodiments of the disclosure.

What is claimed is:

1. A microelectronic device comprising:
a stack structure comprising blocks separated from one another by dielectric slot structures and each including a vertically alternating sequence of conductive structures and insulative structures arranged in tiers, at least one of the blocks comprising:
two crest regions;
a stadium structure interposed between the two crest regions in a first horizontal direction and comprising opposing staircase structures each having steps comprising edges of the tiers; and
two bridge regions neighboring opposing sides of the stadium structure in a second horizontal direction orthogonal to the first horizontal direction and having upper surfaces substantially coplanar with upper surfaces of the two crest regions; and
a filled trench vertically overlying and within horizontal boundaries of the stadium structure of the at least one of the blocks, the filled trench comprising:
dielectric liner structures comprising dielectric material;
additional dielectric liner structures alternating with the dielectric liner structures and comprising additional dielectric material having a different material composition than that of the dielectric material; and
dielectric fill material overlying an alternating sequence of the dielectric liner structures and additional dielectric liner structures.

2. The microelectronic device of claim 1, wherein:
the dielectric liner structures individually have a first thickness; and
the additional dielectric liner structures individually have a second thickness different than the first thickness.

3. The microelectronic device of claim 1, wherein:
the dielectric liner structures individually comprise dielectric nitride material;
the additional dielectric liner structures individually comprise dielectric oxide material; and
the dielectric fill material comprises additional dielectric oxide material.

4. The microelectronic device of claim 3, wherein each of the dielectric liner structures has a smaller thickness than each of the additional dielectric liner structures.

5. The microelectronic device of claim 3 wherein the filled trench comprises at least two of the dielectric liner structures and at least two of the additional dielectric liner structures.

6. The microelectronic device of claim 1, wherein the dielectric liner structures and the additional dielectric liner structures each substantially continuously extend over horizontally extending surfaces and vertically extending surfaces within the horizontal boundaries of the stadium structure.

7. The microelectronic device of claim 1, further comprising a dielectric barrier liner interposed between at least one stadium structure and the alternating sequence of the dielectric liner structures and additional dielectric liner structures, a material composition of the dielectric barrier liner different than that of the dielectric material of the dielectric liner structures.

8. The microelectronic device of claim 1, further comprising contact structures within the horizontal boundaries of the stadium structure of the at least one of the blocks, the contact structures vertically extending completely through the filled trench and each of the tiers of the stack structure underlying the filled trench.

9. The microelectronic device of claim 8, wherein the contact structures comprise conductive material.

10. The microelectronic device of claim 8, further comprising additional contact structures vertically extending completely through the filled trench and terminating on portions of the conductive structures of the tiers of the stack structure defining the steps of the stadium structure, at least one of the additional contact structures horizontally interposed between vertically extending portions of two of the dielectric liner structures.

11. A method of forming a microelectronic device, comprising:
forming a preliminary stack structure comprising a vertically alternating sequence of sacrificial material and insulative material arranged in tiers, the preliminary stack structure further comprising a stadium structure comprising opposing staircase structures having steps comprising edges of the tiers of the preliminary stack structure;
forming a filled trench vertically over and within a horizontal area of the stadium structure, the filled trench comprising:
a first dielectric liner structure comprising a first dielectric material extending continuously over surfaces of the preliminary stack structure within the horizontal area of the stadium structure;
a second dielectric liner structure comprising a second dielectric material having a different material composition than the first dielectric material extending continuously over surfaces of the first dielectric liner structure;
a third dielectric liner structure comprising the first dielectric material extending continuously over surfaces of the second dielectric liner structure;
a fourth dielectric liner structure comprising the second dielectric material extending continuously over surfaces of the third dielectric liner structure; and
a dielectric fill material overlying the fourth dielectric liner structure;
a second dielectric fill material over the second dielectric liner structure;
forming contact structures within the horizontal area of the stadium structure, the contact structures vertically extending completely through the filled trench and each of the tiers of the preliminary stack structure underlying the filled trench; and
replacing the sacrificial material of the tiers of the preliminary stack structure with conductive material after forming the contact structures.

12. The method of claim 11, wherein forming the contact structures comprises:
removing portions of the dielectric fill material, the fourth dielectric liner structure, the third dielectric liner structure, the second dielectric liner structure, the first dielectric liner structure, and the preliminary stack structure to form contact openings; and filling the contact openings with one or more of dielectric material and conductive material.

13. The method of claim 12, wherein forming the contact openings comprises forming a horizontal cross-sectional area of each of the contact openings to be substantially uniform across an entire vertical height of the contact opening.

14. The method of claim 12, wherein forming the contact openings comprises forming each of the contact openings to follow a substantially vertical path through the filled trench.

15. The method of claim 12, wherein filling the contact openings with one or more of dielectric material and conductive material comprises:

covering surfaces defining the contact openings with the dielectric material; and filling remaining portions of the contact openings with the conductive material.

16. The method of claim 11, further comprising forming additional contact structures extending through the filled trench after replacing the sacrificial material of the tiers of the preliminary stack structure with the conductive material.

17. A memory device, comprising:

a stack structure comprising tiers each comprising a conductive material and an insulative material vertically neighboring the conductive material, the stack structure divided into blocks extending in parallel in a first direction and separated from one another in a second direction by dielectric slot structures, each of the blocks comprising a stadium structure comprising opposing staircase structures individually having steps comprising horizontal ends of at least some the tiers of the stack structure;

filled trenches within the blocks of the stack structure, each of the filled trenches vertically over and within a horizontal area of the stadium structure of one of the blocks of the stack structure and comprising:

an alternating sequence of dielectric liner structures and additional dielectric liner structures, the dielectric liner structures having a different material composition than the additional dielectric liner structures; and a dielectric fill material vertically overlying and horizontally surrounded by the alternating sequence of the dielectric liner structures and the additional dielectric liner structures; and strings of memory cells vertically extending through a portion of each of the blocks neighboring the stadium structure in the first direction.

18. The memory device of claim 17, wherein each of the filled trenches comprises at least two of the dielectric liner structures, each of the dielectric liner structures having a thickness in a range from about 20 nm to about 200 nm.

19. The memory device of claim 17, wherein:

the dielectric liner structures each comprise silicon nitride; and the additional dielectric liner structures each comprise silicon oxide.

20. The memory device of claim 17, further comprising:

conductive contact structures extending completely through the filled trenches in substantially vertical paths, the conductive contact structures also extending completely through portions of the stack structure vertically underlying the filled trenches; and additional conductive contact structures horizontally neighboring the conductive contact structures and coupled to control logic circuitry underlying the stack structure.

* * * * *